United States Patent
Matsuo et al.

(10) Patent No.: US 6,910,933 B1
(45) Date of Patent: Jun. 28, 2005

(54) LIGHT EMITTING ELEMENT AND PRODUCING METHOD THEREOF, AND DISPLAY DEVICE AND LIGHTING DEVICE USING THE SAME

(75) Inventors: Mikiko Matsuo, Nara (JP); Tetsuya Sato, Kadoma (JP); Hisanori Sugiura, Hirakata (JP); Hitoshi Hisada, Toyonaka (JP)

(73) Assignee: Matsushita Electric Industrial Co., Ltd. (JP)

( * ) Notice: Subject to any disclaimer, the term of this patent is extended or adjusted under 35 U.S.C. 154(b) by 587 days.

(21) Appl. No.: 09/857,424

(22) PCT Filed: Oct. 5, 2000

(86) PCT No.: PCT/JP00/06971

§ 371 (c)(1),
(2), (4) Date: Jun. 4, 2001

(87) PCT Pub. No.: WO01/26425

PCT Pub. Date: Apr. 12, 2001

(30) Foreign Application Priority Data

Oct. 5, 1999 (JP) .......................................... 11/284360
Oct. 21, 1999 (JP) .......................................... 11/299657

(51) Int. Cl.[7] .......................... H05B 33/10; H05B 33/14
(52) U.S. Cl. ............................. 445/24; 445/25; 427/66
(58) Field of Search ................................ 313/502, 503, 313/504, 506, 509; 428/690; 427/66

(56) References Cited

U.S. PATENT DOCUMENTS

| | | | | |
|---|---|---|---|---|
| 5,702,833 A | * | 12/1997 | Nagai et al. | 428/690 |
| 5,895,692 A | | 4/1999 | Shirasaki et al. | 427/557 |
| 5,925,980 A | * | 7/1999 | So et al. | 313/504 |
| 6,066,357 A | * | 5/2000 | Tang et al. | 427/66 |
| 6,114,055 A | * | 9/2000 | Choong et al. | 428/690 |
| 6,121,727 A | * | 9/2000 | Kanai et al. | 313/504 |
| 6,265,823 B1 | * | 7/2001 | Dobson et al. | 313/503 |
| 6,575,800 B1 | * | 6/2003 | Kobayashi et al. | 445/24 |
| 2002/0086180 A1 | * | 7/2002 | Seo et al. | 428/690 |
| 2002/0101154 A1 | * | 8/2002 | Seo et al. | 313/506 |

FOREIGN PATENT DOCUMENTS

| | | |
|---|---|---|
| JP | 03-114197 | 5/1991 |
| JP | 04-357694 | 12/1992 |
| JP | 08-279628 | 10/1996 |
| JP | 11-074083 | 3/1999 |
| JP | 11-162640 | 6/1999 |
| JP | 2000-026851 | 1/2000 |

* cited by examiner

Primary Examiner—Mariceli Santiago
(74) Attorney, Agent, or Firm—Parkhurst & Wendel, L.L.P.

(57) ABSTRACT

An organic light-emitting device 10 has the constitution in which an emission region 3 between an anode 2 and a cathode 4 is laminated on a substrate 1. The emission region 3 includes polymer 3A, luminous molecules 3G which are material contributable to emission, and charge transport material 3F.

The luminous molecules 3G and the charge transport material 3F are high in concentration at a side close to the cathode 4 and low in concentration at a side close to the anode 2 in a layer thickness direction of the emission region 3. The organic light-emitting device can be formed by luminous material, or luminous material and charge transport material being penetrated into polymer, or polymer in which charge transport material is dispersed, thus providing highly improved luminous efficiency and at the same time facilitating the patterning.

48 Claims, 20 Drawing Sheets

FIG. 2
(a)
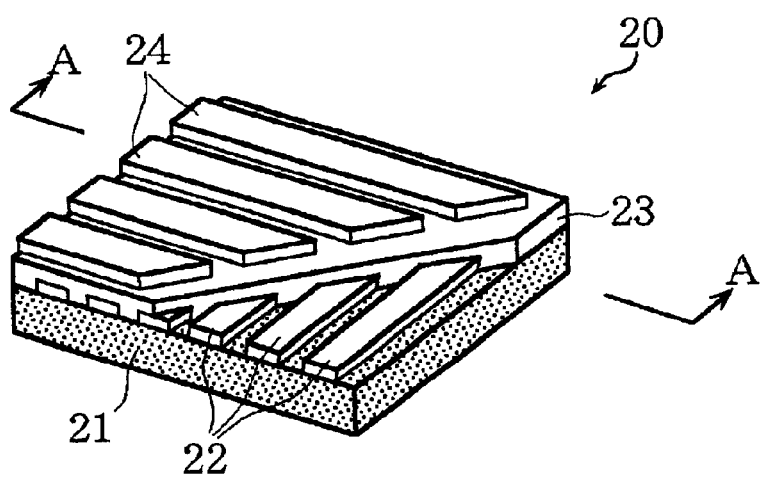
(b)
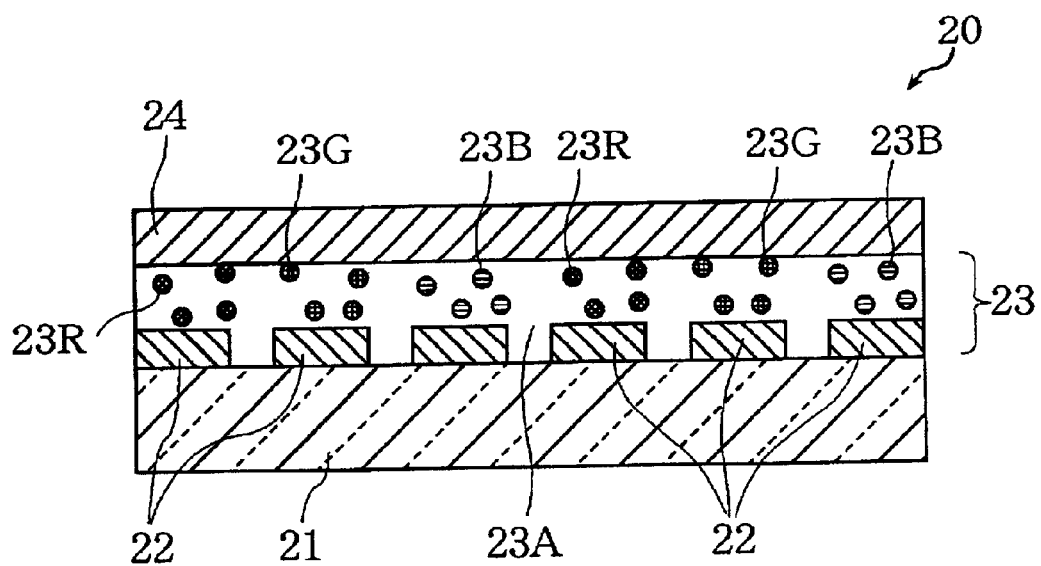

LIGHT EMITTING ELEMENT AND PRODUCING METHOD THEREOF, AND DISPLAY DEVICE AND LIGHTING DEVICE USING THE SAME

TECHNICAL FIELD

The present invention relates to a light-emitting device used as a flat light source and a flat display.

BACKGROUND ART

Electric field light-emitting devices, which have self-luminous property and thus high visibility and excellent display capability and enable high speed response and low-profile, are now attracting the attention as displays for flat displays and the like.

Among others, an organic EL device, using organic compound as phosphor, has characteristic features, as compared with inorganic EL device, that it can be driven at a low voltage, that it can easily produce an enlarged area, and that it can easily produce a desired luminous color by an appropriate choice of coloring matter and, accordingly, the organic EL device is now vigorously developing as a next-generation display.

The EL device using the organic phosphor generates blue luminescence for example, through the application of a voltage of 30 volts to an anthracene evaporated film having thickness of 1 m or less (Thin Solid Films, 94(1982) 171). However, this device fails to produce sufficient luminance even when a high voltage is applied thereto, so that it is required to be further improved to have higher luminous efficiency.

In regard to this, Tang et al. teaches that transparent electrodes (anode), a hole transport layer, an emission region having electron transport capabilities, cathode using metal of low work function are laminated for reduction in voltage and improvement in luminous efficiency, to thereby produce luminance of 1,000 $cd/m^2$ through the application of a voltage of 10V or less (Appl. Phys. Lett. 51 (1987) 913). Used as the phosphor is tris (8-quinolinolato) aluminum complex (hereinafter it is referred to as "Alq"). The Alq is an excellent luminophor having both high luminous efficiency and high electron transport capability.

Further, a device having a three-ply structure wherein an emission region is sandwiched between a hole transport layer and an electron transport layer and a device that obtains luminescence from coloring matter (coumarin derivative or fluorescent dye, such as DCM1, used to the Alq) doped in the emission region is reported (Jpn. J. Appl. Phys., 27 (1988) L269 and J. Appl. Phys., 65(1989) 3610). The report says that it is discovered that an adequate choice of the coloring matter can allow luminous color to change and can produce improved luminous efficiency, as compared with the non-doped one.

In the devices constructed above, all layers are formed by dry process such as a vacuum evaporation method. On the other hand, the method has been proposed of producing the device in the so-called wet deposition process such as a spin coat method and a cast method (Japanese Laid-open (unexamined) Patent Publications No. Hei 3-790 and No. Hei 3-171590).

In this method, at least one material for forming the hole transport layer, the electron transport layer and the emission region is dissolved in appropriate solvent, together with polymer binder. Then, that solution is applied onto the electrode to form the emission region and, thereafter, a further electrode is formed on the emission region in the evaporation method or a like method. Hereinafter, the organic light-emitting device thus produced is called "polymer dispersed light-emitting device", in contrast to the conventional laminated light-emitting device.

When comparing with the organic light-emitting device produced by the dry process, the polymer dispersed light-emitting device has the following advantages.

(1) Even the material for which it is hard to be deposited in the dry process such as evaporation can be used;

(2) Even the doping of minute amounts for which it is hard to be controlled in the dry process can be performed with ease;

(3) An enlarged area can be produced with ease;

(4) The device can be produced at low costs;

(5) Simultaneous luminescence from luminous molecules is enabled with ease through the introduction of a number of luminous molecules (white luminescence is enabled); and (6) In the conventional laminated light-emitting device, the layers are each in the amorphous state. In contrast to this, in the polymer dispersed light-emitting device, the materials are dispersed in the polymer binder. Accordingly, the latter is thermally stable as compared with the former.

The conventional polymer dispersed light-emitting devices comprise the emission region in which perinone derivative or tris (8-quinolinolato) aluminum used as the luminous molecules is dispersed ill polyvinyl carbazol or the emission region in which tris (8-quinolinolato) aluminum and tetraphenyl benzidine used as the luminous molecules are dispersed in polycarbonate (Japanese Laid-open (unexamined) Patent Publications No. Hei 3-790, No. Hei 3-171590).

(First Problem)

The polymer dispersed light-emitting device has the advantages mentioned above, while on the other hand, it has the disadvantage that it is low in luminous efficiency, as compared with the conventional laminated light-emitting device.

Specifically, in the laminated light-emitting device, holes are injected from the anode to the hole transport layer, and electrons are injected from the cathode to the emission region of the electron transport capability or the electron transport layer. When these holes and electrons are recombined in the emission region, excitons are formed, and when the excitons are caused to transition to the ground state, the emission takes place. It is to be noted that the electron transport and the hole transport are functionally separated from each other, so that the recombination of the electron and hole takes place only in the vicinity of an interface between the adjoining layers. This can produce the efficient production of the excitons and thus improved luminous efficiency.

Further, through an appropriate choice of the material of the layers adjoining the respective electrodes to minimize injection barriers between the anode and the cathode, the injection of the hole and the electron can be facilitated, and as such can allow the drive at a low voltage.

In contrast to this, the polymer dispersed light-emitting device mainly comprises a monolayer, so that the recombination of the hole and electron and the production of the excitons do not take place locally, differently from the laminated light-emitting device mentioned above. In addition, the barriers for the hole and the electron to be injected from the electrodes are high. These facts make it difficult to improve luminous efficiency.

Thus, the emission site is dispersed over the whole emission region, so that it is hard to balance the injection of the hole and electron and the transport of the same. As a result of this, the probability of the recombination reduces, such that sufficient luminous efficiency is not produced. This indicates that collection of the recombination region of the hole and electron into a specific region leads up to improvement in luminous efficiency.

Though the method of laminating the functionally separated layers is of effective, as mentioned above, in a polymeric system formed by coating, solvent contained in polymer solution of a second layer to be laminated over a first deposited layer must be chosen to prevent the first deposited layer from being dissolved in that solvent.

In addition, as the laminated-layers increase in number, the need to choose the solvent and the need to choose the material soluble in that selected solvent arise increasingly. This arises the problem that the range of choice for the material is further narrowed, thus hindering the effectively improved efficiency.

(Second Problem)

Further, the polymer dispersed light-emitting device involves the problem that when a color panel is produced, it is difficult to do the patterning (distribution of application of color). When the color panel is produced in the dry process such as the vacuum evaporation method, elements of color can be formed in desired positions by an evaporation mask being set on a substrate. In contrast to this, in the wet deposition such as the spin coat method or the cast method, since the emission region is formed over the whole area of the substrate, the above-mentioned patterning cannot be performed.

In regard to this, the patterning using an ink-jet method has been proposed (e.g. Japanese Laid-open (unexamined) Patent Publication No. Hei 10-12377). This proposes that material of the emission region including polymer or the precursor of polymer is discharged from nozzles by the ink-jet method to form a desired pattern.

However, the patterning using the conventional ink-jet method involves the problem that polymer solution or equivalent to be coated is high in viscosity, so that the nozzles of the ink head are easily plugged up and, accordingly, it is difficult to form a micropattern.

To solve the problems mentioned above, the present invention has been made. The present invention provides an organic light-emitting device capable of producing highly improved luminous efficiency and at the same time facilitating the patterning even in the polymer dispersed organic light-emitting device and the producing method thereof.

DISCLOSURE OF THE INVENTION

In the light of the current situation, a group of inventions have been made. The object of the invention is to provide a light-emitting device having high luminous efficiency.

Although the group of inventions is based on the same or similar conception, since they are realized by way of different embodiments, the inventive groups are divided into the first inventive group and the second inventive group on the basis of their respective relevance in the specification. In the following, the contents will be explained in order for each division (each inventive group).

First Inventive Group

After having devoted themselves to the studies in order to attain the object, the inventors of this application have found that in producing a polymer dispersed light-emitting device, a polymer layer is first formed and then luminous molecules, or luminous molecules and charge transport are penetrated in the polymer layer thus formed, thereby producing a highly improved luminous efficiency and at the same time facilitating the patterning.

Specifically, a first aspect of the invention is directed to a light-emitting device having an emission region between an anode and a cathode, wherein the emission region comprises material contributable to emission and a medium for containing the material, and wherein the material contributable to the emission has a substantially successive distribution of concentration from the anode side of the emission region toward the cathode side thereof.

A second aspect of the invention is directed to the light-emitting device as set forth in the first aspect of the invention, wherein the material contributable to the emission exhibits the distribution of concentration according to which any one of the anode side of the emission region and the cathode side thereof is higher in concentration than the other, and the concentration reduces from the one side toward the other side successively.

With this constitution, in a region where the material contributable to the emission in the emission region is high in concentration, the hole injected from the anode into the emission region and the electron injected from the cathode into the emission region are recombined. Thus, the recombination region of the hole and the electron is collected, so that the recombination efficiency of the electron and the hole is increased and thus the luminous efficiency is improved.

The terminology "material contributable to emission" is intended to include, for example, material that form organic binder, charge transport material and dimmer, excimer, or exciplex to obtain emission therefrom, in addition to the luminous molecules that emit light by the injection of electric charge as shown in Embodiments as will be mentioned later. It is noted here that the terminology of the dimmer means material combined with the organic binder or the charge transport material in the ground state and the terminology of the excimer and the exciplex means material caused to react with the organic binder or the charge transport material in the excitation state caused by the injection of the charge.

A third aspect of the invention is directed to the light-emitting device as set forth in the first aspect of the invention, wherein the emission region further comprises charge transport material.

The charge transport capabilities in the emission region are further improved and thus the recombination efficiency of the electron and the hole is improved.

A fourth aspect of the invention is directed to the light-emitting device as set forth in the third aspect of the invention, wherein the charge transport material has a substantially successive distribution of concentration from the anode side of the emission region toward the cathode side thereof.

With this constitution, a region large in hole transport capability and a region large in electron transport capability are formed in the emission region, as viewed in a direction extending from the anode side to the cathode side (layer thickness direction), so that the recombination efficiency of the electron and the hole is improved.

A fifth aspect of the invention is directed to a light-emitting device having a charge transport region between an anode and a cathode, wherein the charge transport region comprises charge transport material and a medium for containing the charge transport material, and wherein the charge transport material has a substantially successive distribution of concentration from the cathode side of the charge transport region toward the anode side thereof.

With this constitution, a region large in hole transport capability and a region large in electron transport capability are formed in the emission region, so that the recombination efficiency of the electron and the hole is improved. In the constitution above, the charge transport region has luminescent properties and thus doubles as the emission region.

A sixth aspect of the invention is directed to the light-emitting device as set forth in the first aspect of the invention, wherein the emission region includes a region where the material contributable to the emission is not present.

With this constitution, a region different in carrier transport capability is formed in the emission region, so that the recombination efficiency of the electron and the hole is further improved and thus the luminance efficiency is improved.

A seventh aspect of the invention is directed to the light-emitting device as set forth in the first aspect of the invention, wherein a part of the emission region that exhibits the maximum concentration of the material contributable to the emission is away from the anode and the cathode.

The reason that the part of the emission region that exhibits the maximum concentration of the material contributable to the emission is away from the both electrodes is that when the material contributable to the emission is close to the anode or the cathode, there is the possibility that the material contributable to the emission may be extinguished without emitting. The part of the emission region that exhibits the maximum concentration of the material contributable to the emission is preferable at a substantially immediate position between the anode and the cathode.

An eighth aspect of the invention is directed to the light-emitting device as set forth in the fifth aspect of the invention, wherein the charge transport region includes a region where the charge transport material is not present.

With this constitution, in the boundary between the region where the charge transport material is present and the region where the charge transport material is not present a region, the recombination efficiency of the electron injected from the cathode and the hole injected from the anode is further improved and thus the luminance efficiency is improved.

A ninth aspect of the invention is directed to the light-emitting device as set forth in the fifth aspect of the invention, wherein a part of the charge transport region that exhibits the maximum concentration of the charge transport material is away from the anode and the cathode.

A tenth aspect of the invention is directed to the lighting device using the light-emitting device as set forth in the first aspect of the invention.

With this constitution, the lighting device having improved luminance efficiency can be provided.

An 11th aspect of the invention is directed to a light-emitting device having an emission region between an anode and a cathode, wherein the emission region comprises material contributable to emission and a medium for containing the material, and wherein the material contributable to the emission has a distribution of concentration that reduces substantially successively in a direction parallel to a surface of the cathode and a surface of the anode from a substantially center of the emission region toward a periphery thereof.

A 12th aspect of the invention is directed to the light-emitting device as set forth in the 11th aspect of the invention, wherein there are provided a number of materials contributable to the emissions and are adjacently arranged in a direction parallel to a surface of the cathode and a surface of the anode, and wherein the materials contributable to the emissions are different from each other in luminous color.

With this constitution, since the concentration is low in regions in the vicinity of the boundaries between the materials contributable to the emission, the materials contributable to the emission are prevented from being mixed with each other. Thus, the light-emitting device that provides excellent full color display capability with little color mixture is produced.

A 13th aspect of the invention is directed to the light-emitting device as set forth in the 11th aspect of the invention, wherein the emission region further comprises charge transport material.

A 14th aspect of the invention is directed to the light-emitting device as set forth in the 13th aspect of the invention, wherein the charge transport material has a distribution of concentration that reduces in the direction parallel to the surface of the cathode and the surface of the anode from the substantially center of the emission region toward the periphery thereof.

A 15th aspect of the invention is directed to the light-emitting device as set forth in the 11th aspect of the invention, wherein the material contributable to the emission has a substantially successive distribution of concentration from the cathode side of the emission region toward the anode side thereof.

With this constitution, since the material contributable to the emission is made to have the distribution of concentration so that the recombination region of the hole and the electron is collected, the recombination efficiency of the electron and the hole is improved and thus the luminance efficiency is improved.

A 16th aspect of the invention is directed to the light-emitting device as set forth in the 14th aspect of the invention, wherein the charge transport material has a substantially successive distribution of concentration from the cathode side of the emission region toward the anode side thereof.

With this constitution, the recombination efficiency of the electron and the hole is further improved and thus the luminance efficiency is improved.

A 17th aspect of the invention is directed to the light-emitting device as set forth in the 11th aspect of the invention, wherein the emission region includes a region where the material contributable to the emission is not present.

An 18th aspect of the invention is directed to the light-emitting device as set forth in the 11th aspect of the invention, wherein the medium for containing the material contributable to the emission has charge transport capability.

A 19th aspect of the invention is directed to the light-emitting device as set forth in the 11th aspect of the invention, wherein the medium for containing the material contributable to the emission comprises organic material.

A 20th aspect of the invention is directed to the light-emitting device as set forth in the 11th aspect of the invention, wherein the medium comprises polymer.

With this constitution in which the emission region comprises organic material, or to be more specific, polymer, the organic light-emitting device having an improved efficiency is produced.

A 21st aspect of the invention is directed to a display using the light-emitting device as set forth in the 11th aspect of the invention.

With this constitution, the display having an improved luminous efficiency is provided.

A 22nd aspect of the invention is directed to a producing method of a light-emitting device having an emission region between an anode and a cathode, the producing method comprising: a disposing step of disposing a medium on the anode or the cathode; and a containing step of allowing material contributable to emission to be contained in the medium to form the emission region.

Since this method comprises the step of disposing the medium on the anode or the cathode and the step of allowing material contributable to emission to be contained in the medium, it can provide an effective method when it is difficult to dispose the medium previously containing the material contributable to the emission on the anode or the cathode.

A 23rd aspect of the invention is directed to a producing method of a light-emitting device having an emission region between an anode and a cathode, the producing method comprising a disposing step of disposing a medium containing charge transport material on the anode or the cathode; and a containing step of allowing material contributable to emission to be contained in the medium to form the emission region.

This method enables the charge transport material to be contained in the medium, and as such can produce the light-emitting device that can inject and transport the charge with efficiency.

A 24th aspect of the invention is directed to a producing method of a light-emitting device having an emission region between an anode and a cathode, the producing method comprising a disposing step of disposing a medium on the anode or the cathode; and a containing step of allowing material contributable to emission and charge transport material to be contained in the medium.

A 25th aspect of the invention is directed to a producing method of a light-emitting device having an emission region between an anode and a cathode, the producing method comprising a disposing step of disposing a medium containing charge transport material on the anode or the cathode; and a containing step of allowing material contributable to emission and charge transport material to be contained in the medium.

The charge of the charge transport material contained in the medium in the disposing step and the charge of the charge transport material in the containing step may be different from or identical to each other.

A 26th aspect of the invention is directed to a producing method of a light-emitting device having a charge transport region between an anode and a cathode, the producing method comprising a disposing step of disposing a medium on the anode or the cathode; and a containing step of allowing charge transport material to be contained in the medium.

A 27th aspect of the invention is directed to the producing method of a light-emitting device as set forth in the 23rd aspect of the invention, wherein in the containing step, the material contributable to the emission is penetrated into the medium, whereby it is contained in the medium.

A 28th aspect of the invention is directed to the producing method of a light-emitting device as set forth in the 24th aspect of the invention, wherein in the containing step, the material contributable to the emission and the charge transport material are penetrated into the medium, whereby they are contained in the medium.

This method provides the light-emitting device that enables the material contributable to the emission, or the material contributable to the emission and the charge transport material to have a substantially successive distribution of concentration from the anode side of the charge transport region toward the cathode side thereof and vice versa.

A 29th aspect of the invention is directed to the producing method of a light-emitting device as set forth in the 23rd aspect of the invention, wherein in the containing step, solution obtained by the material contributable to the emission being dissolved in solvent is brought into contact with the medium, whereby the material is penetrated into the medium.

A 30th aspect of the invention is directed to the producing method of a light-emitting device as set forth in the 24th aspect of the invention, wherein in the containing step, solution obtained by the material contributable to the emission and the charge transport material being dissolved in solvent is brought into contact with the medium, whereby the materials are penetrated into the medium.

This method also provides the light-emitting device that enables the material contributable to the emission, or the material contributable to the emission and the charge transport material to have a substantially successive distribution of concentration from the anode side of the charge transport region toward the cathode side thereof and vice versa.

A 31st aspect of the invention is directed to the producing method of a light-emitting device as set forth in the 27th aspect of the invention, wherein in the containing step, the material contributable to the emission is penetrated into the medium in an ink jet method.

The method above allows the material contributable to he emission to penetrate into the medium in the ink-jet method, so that when polymer high in viscosity is used as the precursor of the medium, the need of the application of the polymer solution and the material contributable to the emission in the ink-jet method can be eliminated. Therefore, the nozzles of the ink jet are prevented from being plugged and also fine patterns can be formed with ease.

Second Inventive Group

On the basis of the concept that collection of the luminous molecules, which were dispersed over the whole organic layer, to a specific region and enlargement of the surface area of the organic layer lead to improvement in efficiency of the polymer-based organic light-emitting device, the inventors of this application disperse the luminous molecules on a front surface of the organic layer or in a region in the vicinity of the front surface of the same and thereby solve the problems mentioned above.

Specifically, a 32nd aspect of the invention is directed to a light-emitting device having an emission region between an anode and a cathode, wherein the emission region comprises material contributable to emission, and wherein a collecting means for collecting the material contributable to the emission to a specific region is provided between the anode and the cathode.

To be more specific, a 33rd aspect of the invention is directed to a light-emitting device having an emission region between an anode and a cathode, wherein at least one of an anode side of the emission region and a cathode side thereof is made porous, and wherein material contributable to emission is included in a surface of the emission region which is made porous.

A 34th aspect of the invention is directed to a light-emitting device having an emission region between an anode and a cathode, wherein at least one of an anode side of the emission region and a cathode side thereof is made porous, and wherein material contributable to emission is included in a region in the vicinity of a surface of the emission region which is made porous.

With the constitutions above, the material contributable to emission is collected to a specific region, or specifically, to a surface of the emission region which is made porous or to a region in the vicinity of the surface thereof and also the recombination region of the hole and the electron in which the material contributable to emission is present is enlarged. Thus, the emission with improved luminance can be produced.

A 35th aspect of the invention is directed to the light-emitting device as set forth in the 33rd aspect of the invention, wherein charge transport material is included in a surface of the emission region which is made porous.

A 36th aspect of the invention is directed to the light-emitting device as set forth in the 33rd aspect of the invention, wherein a leveled layer comprising charge transport material is provided on a surface of the emission region which is made porous.

With this constitution, leakage of current is prevented and also the injection and transport of the hole or the electron can be performed with improved efficiency. Further, the leveled layer can permit the joint surface of the adjacent anode and cathode to be kept smooth A 37th aspect of the invention is directed to a light-emitting device having a charge transport region between an anode and a cathode, wherein at least one of an anode side of the charge transport region and a cathode side thereof is made porous.

With this constitution, the charge can be injected from the electrodes (anode and cathode) into the charge transport region with improved efficiency. In this constitution, the charge transport region is a region having the luminescent property and thus doubles as the property of the emission region.

A 38th aspect of the invention is directed to the light-emitting device as set forth in the 37th aspect of the invention, wherein the charge transport region is a hole transport region.

A 39th aspect of the invention is directed to the light-emitting device as set forth in the 37th aspect of the invention, wherein the charge transport region is an electron transport region.

A 40th aspect of the invention is directed to the light-emitting device as set forth in the 33rd aspect of the invention, wherein the emission region comprises an organic matter.

A 41st aspect of the invention is directed to the light-emitting device as set forth in the 33rd aspect of the invention, wherein the emission region comprises polymer.

A 42nd aspect of the invention is directed to a light-emitting device having an emission region between an anode and a cathode, wherein at least one of an anode side of the emission region and a cathode side thereof is roughened, and wherein material contributable to emission is included in a surface of the roughened emission region.

A 43rd aspect of the invention is directed to a light-emitting device having an emission region between an anode and a cathode, wherein at least one of an anode side of the emission region and a cathode side thereof is roughened, and wherein material contributable to emission is included in a region in the vicinity of a roughened surface of the emission region.

With these constitutions, the surface area of the recombination region of the hole and the electron where the material contributable to emission is present is enlarged, thus producing the emission with improved luminance.

A 44th aspect of the invention is directed to the light-emitting device as set forth in the 42nd aspect of the invention, wherein a leveled layer comprising charge transport material is provided on a roughened surface of the emission region.

A 45th aspect of the invention is directed to a light-emitting device having a charge transport region between an anode and a cathode, wherein at least one of an anode side of the charge transport region and a cathode side thereof is roughened.

With this constitution, the charge can be injected from the electrodes (anode and cathode) into the charge transport region with improved efficiency. When he emission region is located over the roughened charge transport region, the contact area of the emission region and the charge transport region is enhanced, so that the hole can be injected from the anode into the emission region with improved efficiency.

A 46th aspect of the invention is directed to the light-emitting device as set forth in the 45th aspect of the invention, wherein the charge transport region is a hole transport region.

A 47th aspect of the invention is directed to the light-emitting device as set forth in the 45th aspect of the invention, wherein the charge transport region is an electron transport region.

A 48th aspect of the invention is directed to the light-emitting device as set forth in the 42nd aspect of the invention, wherein the emission region comprises an organic matter.

A 49th aspect of the invention is directed to the light-emitting device as set forth in the 42nd aspect of the invention, wherein the emission region comprises polymer.

A 50th aspect of the invention is directed to a display using the light-emitting device as set forth in the 33rd aspect of the invention.

A 51st aspect of the invention is directed to a lighting device using the light-emitting device as set forth in the 33rd aspect of the invention.

With the constitutions above, the display and the lighting device having improved luminous efficiency can be provided.

A 52nd aspect of the invention is directed to a producing method of a light-emitting device having an emission region between an anode and a cathode, the producing method comprising a medium disposing step of disposing a medium on the anode or the cathode; and a porosity producing step of making at least a part of the medium porous.

A 53rd aspect of the invention is directed to a producing method of a light-emitting device having an emission region between an anode and a cathode, the producing method comprising a medium disposing step of disposing a medium on the anode or the cathode; a porosity producing step of making at least one of an anode side of the medium and a cathode side thereof porous; and a disposing step of disposing material contributable to emission on a porous surface of the medium, so that the emission region is formed by the medium and the material contributable to the emission.

A 54th aspect of the invention is directed to a producing method of a light-emitting device having an emission region between an anode and a cathode, the producing method comprising a medium disposing step of disposing a medium on the anode or the cathode; a porosity producing step of making at least one of an anode side of the medium and a cathode side thereof porous; a containing step of allowing material contributable to emission to be contained in a region in the vicinity of a porous surface of the medium, so that the emission region is formed by the medium and the material contributable to the emission; and a disposing step of disposing charge transport material on a porous surface of the medium.

With this constitution, the material contributable to the emission is collected to the porous surface of the emission region or the region in the vicinity of the porous surface of the same and also the surface area of he recombination region of the hole and the electron is enlarged, thus providing the light-emitting device with improved luminance.

A 55th aspect of the invention is directed to the producing method of a light-emitting device as set forth in the 53rd aspect of the invention, which comprises a disposing step of disposing charge transport material on a porous surface of the emission region.

A 56th aspect of the invention is directed to the producing method of a light-emitting device as set forth in the 53rd aspect of the invention, which comprises a leveled layer forming step of forming a leveled layer comprising charge transport material on the emission region.

With the constitutions above in which the leveled layer is formed over the emission region, the light-emitting device is provided having the capabilities that leakage of current is prevented and also the injection and transport of the hole or the electron can be performed with improved efficiency and further, the leveled layer can permit the joint surface of the adjacent anode and cathode to be kept smooth.

A 57th aspect of the invention is directed to the producing method of a light-emitting device as set forth in the 53rd aspect of the invention, wherein the disposing step is a step of disposing a medium containing material soluble in a specified solvent, and the porosity producing step is a step of eluting the material from the solvent to thereby make the medium porous.

A 58th aspect of the invention is directed to a producing method of a light-emitting device having an emission region between an anode and a cathode, the producing method comprising a medium disposing step of disposing a medium on the anode or the cathode; and a roughening step of roughening a part of the medium.

A 59th aspect of the invention is directed to a producing method of a light-emitting device having an emission region between an anode and a cathode, the producing method comprising a medium disposing step of disposing a medium on the anode or the cathode; a roughening step of roughening at least one of an anode side of the medium and a cathode side thereof, and a disposing step of disposing material contributable to emission on a roughened surface of the medium, so that the emission region is formed by the medium and the material contributable to the emission.

A 60th aspect of the invention is directed to a producing method of a light-emitting device having an emission region between an anode and a cathode, the producing method comprising a medium disposing step of disposing a medium on the anode or the cathode; a roughening step of roughening at least one of an anode side of the medium and a cathode side thereof, and a containing step of allowing material contributable to emission to be contained in a region in the vicinity of a roughened surface of the medium, so that the emission region is formed by the medium and the material contributable to the emission.

With the constitutions above, the material contributable to the emission is collected to the roughened surface of the emission region or the region in the vicinity of the roughened surface of the same and also the surface area of the recombination region of the hole and the electron where the material contributable to the emission is present is enlarged, thus providing the light-emitting device having the capability of producing improved luminance.

A 61st aspect of the invention is directed to the producing method of a light-emitting device as set forth in the 59th aspect of the invention, which comprises a leveled layer forming step of forming a leveled layer comprising charge transport material on the emission region.

With this constitution, the light-emitting device is provided having the capabilities that leakage of current is prevented and also the injection and transport of the hole or the electron can be performed with improved efficiency and further, the joint surface of the adjacent anode and cathode can be kept smooth.

A 62nd aspect of the invention is directed to the producing method of a light-emitting device as set forth in the 59th aspect of the invention, wherein the roughening step is a step of roughening the emission region by dry etching.

The dry etching enables the emission region to be roughened with ease.

BRIEF DESCRIPTION OF THE DRAWINGS

FIG. 2 shows schematic diagrams illustrating construction of an organic light-emitting device according to an embodiment 1-2 of the present invention, FIG. 2(a) is a schematic conceptual diagram of the organic light-emitting device and FIG. 2(b) is a sectional view taken along the arrowed line A—A of FIG. 2(a);

BEST MODE FOR CARRYING OUT THE INVENTION

Embodiments of First Inventive Group

In the following, the first inventive group of the present invention will be described with reference to the accompanying drawings.

While in the embodiments illustrated below (the same applies to the second inventive group), description is given on an organic light-emitting device, the concept of the present invention above is applicable not only to the organic light-emitting device but also to an inorganic light-emitting device wherein an emission region is formed, for example, by inorganic phosphor being dispersed in an organic binder.

Embodiment 1-1

Figure 1:
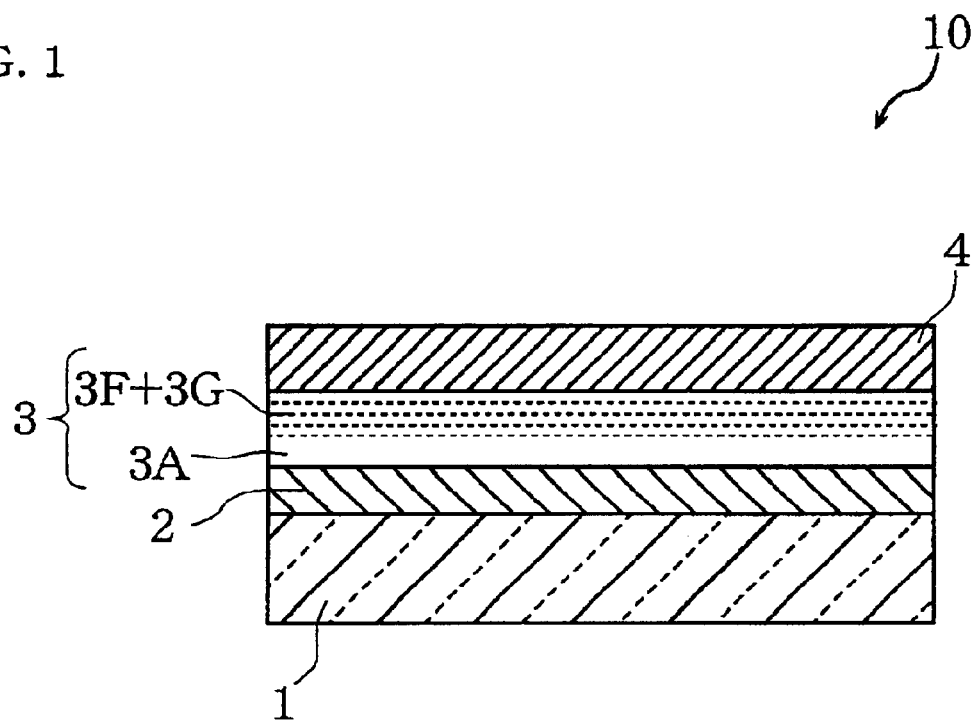
FIG. 1 is a schematic sectional view of an organic light-emitting device according to an embodiment 1-1 of the present invention.

FIG. 1 is a schematic sectional view of an organic light-emitting device according to an embodiment 1-1 of the present invention.

As shown in FIG. 1, an organic light-emitting device 10 comprises an anode 2 formed on a substrate 1, a cathode 4 arranged in opposition to the anode 2, and an emission region 3 interposed between the anode 2 and the cathode 4.

The emission region 3 comprises polymer 3A, luminous molecules 3G of material contributable to the emission, and charge transport materials 3F. In FIG. 1, only one kind of luminous molecules is shown.

The luminous molecules 3G and the charge transport materials 3F are distributed in concentration in a layer thickness direction of the emission region 3 (from the anode 1 to the cathode 4). Specifically, the concentration of the luminous molecules 3G and the charge transport materials 3F are large at a side of the emission region 3 close to the cathode 4 (the upper side as viewed in the diagram) and are small at a side thereof close to the anode 2 (the lower side as viewed in the diagram). Preferably, the emission region 3 has a region in the layer thickness direction thereof where neither the luminous molecules 3G nor the charge transport materials 3F are provided. In other words, it is preferable that the emission region 3 has, at the side thereof close to the anode 2, a region where neither the luminous molecules nor the charge transport material exists but only the polymer 3A exists.

While it is described that the luminous molecules 3G and the charge transport materials 3F are distributed in concentration in the layer thickness direction of the emission region, modification may be made such that only the luminous molecules 3G are distributed in concentration in the layer thickness direction of the emission region 3 and the charge transport materials 3F are uniformly distributed in the layer thickness direction thereof.

Another modification may also be made of the organic light-emitting device, such that the emission region 3 comprises only the polymer 3A and the luminous molecules 3G (not include the charge transport materials 3F) and the luminous molecules 3G are distributed in concentration in the layer thickness direction.

An emission mechanism of the organic light-emitting device of the present invention is as follows. In the organic light-emitting device 10 shown in FIG. 1, when a positive voltage is applied to the anode 2 and a negative voltage is applied to the cathode 4, the hole is injected into the emission region 3 from the anode 2 and the electron is injected into the emission region 3 from the cathode 4. Then, the injected hole flows to the cathode 4 and the injected electron flows to the anode 2. The hole and the electron are recombined in the emission region 3, in response to which fluorescence or phosphorescence is emitted from the luminous molecules 3G in the emission region 3.

The following points can be cited as major factors for determining current efficiency of the emission (emission efficiency for the injected current) include:

(1) Efficiency of recombination of the hole and electron for the injected current;

(2) Efficiency of generation of the excitons of the luminous molecules sequent from the recombination; and (3) Efficiency of generation of luminous quantum from the excitons of the luminous molecules;

Of the factors above, (2) and (3) are practically determined by the luminous molecules' properties themselves.

On the other hand, the efficiency of recombination of the hole and electron of (1) is most influenced by the balance between the hole and the electron. If the hole and the electron are badly balanced, even if they are injected from the electrode, excess carriers reach the opposite electrode without being recombined in the emission region, resulting in wasteful currents that do not contribute to the emission.

If the mobility of the carriers in the emission region is enhanced, then the hole and the electron flow in a balanced manner and the luminous efficiency is improved. Specifically, it is preferable that the mobility of the hole is $1 \times 10^{-7}$ cm$^2$/V·s or more and the mobility of the electron is $5 \times 10^{-8}$ cm$^2$/V·s or more.

When viewing from the emission mechanism mentioned above, in the case where the emission region includes a region of high hole transportability and a region of high electron transportability with respect to the layer thickness direction, or specifically, in the case where the hole transportability is high on the anode side of the emission region and the electron transportability is high on the cathode side of the same, the hole and the electron injected from the anode and the cathode respectively are locally recombined in the vicinity of the interface of the both regions.

Thus, when the luminous molecules 3G and the charge transport materials 3F are distributed in concentration in the layer thickness direction, as shown in FIG. 1, or preferably, when the emission region 3 includes a region in which neither the luminous molecules 3G nor the charge transport materials 3F exists, a region different in carrier transportability is formed in the emission region 3, so that the recombination efficiency of the above-noted (1) is further improved and the emission efficiency is also improved.

Embodiment 1-2

FIG. 2 shows schematic diagrams illustrating construction of an organic light-emitting device according to an embodiment 1-2 of the present invention. FIG. 2(a) is a schematic conceptual diagram of the organic light-emitting device and FIG. 2(b) is a sectional view taken along the arrowed line A—A of FIG. 2(a).

As shown in FIG. 2, an organic light-emitting device 20 is a simple matrix type one comprising anodes 22 formed on a substrate 21 in a striped form, an emission region 23 formed on the anodes 22, and cathodes 24 formed on the emission region 23 in a striped form to extend orthogonal to the anodes 22.

The substrate 21 may be made of any material capable of supporting the organic light-emitting device 20 of the present invention. A transparent substrate made of glass or resin film such as polycarbonate, polymethyl methacrylate, and polyethylene terephthalate, or an opaque substrate made of silicon can be used as the substrate.

At least either of the anodes 22 and the cathodes 24 must be transparent or translucent to take out the light generated from the emission region 23 through the either or both of the electrodes.

While the transparent electrodes made of for example indium tin oxide (ITO) or tin oxide are often used as the anodes 22 in general, metallic electrodes made of, for example, Ni, Au, Pt, Pd, may be used. As for the ITO film, the deposition processes, such as a sputtering, an electron beam evaporation, an ion plating, is adopted, for the sake of improving the transparency or reducing the resistivity. The layer thickness is determined from a required sheet resistance and a required visible light transmittance, but since the organic light-emitting device is relatively large in drive current density, the film is often used with the thickness of 1,000 or more, in order to reduce the sheet resistance.

Laminated electrodes of metal, such as Al, Ag and Au, alloy composed of metal of low in work function and metal of relatively large in work function and stable, such as MgAg alloy and AlLi alloy, and alloy composed of metal of low in work function and metal of high in work function, such as Li/Al and LiF/Al, can be used as the cathodes 24. These cathodes are preferably formed in the evaporation or the sputtering.

The anodes 22 and the cathodes 24 are the electrodes extending orthogonal to each other in the striped form. When a forward voltage is applied to selected anodes and cathodes, the emission region emits light with luminance corresponding to the applied voltage at the intersection points of the both of the electrodes.

While in this embodiment, the substrate 21, the anodes 22, the emission region 23 and the cathodes 24 are laminated in order from the bottom, they are not necessarily required to be laminated in this order. The order of lamination of these, from bottom to top, may be the substrate 21, the cathodes 24, the emission region 23 and the anodes 22.

If only the electrodes on the substrate 21 side or the anodes 22 are transparent and the cathodes 24 are opaque, then the substrate 21 is required to be transparent in order to take out the light generated.

Next, description on the emission region 23 will be given. The emission region 23 comprises polymer 23A, luminous molecules (Red) 23R, luminous molecules (Green) 23G and luminous molecules (Blue) 23B. The polymer 23A is seriated in an in-plane direction of the emission region 23, and a number of luminophors 23R, 23G, 23B are adjacently arranged in the direction parallel to the cathodes 24 and the anodes 22. The luminophors 23R, 23G, 23B are so distributed in density as to substantially continuously reduce from around the center of the emission region to the periphery in the direction parallel to the cathodes 24 and the anodes 22.

Figure 3:
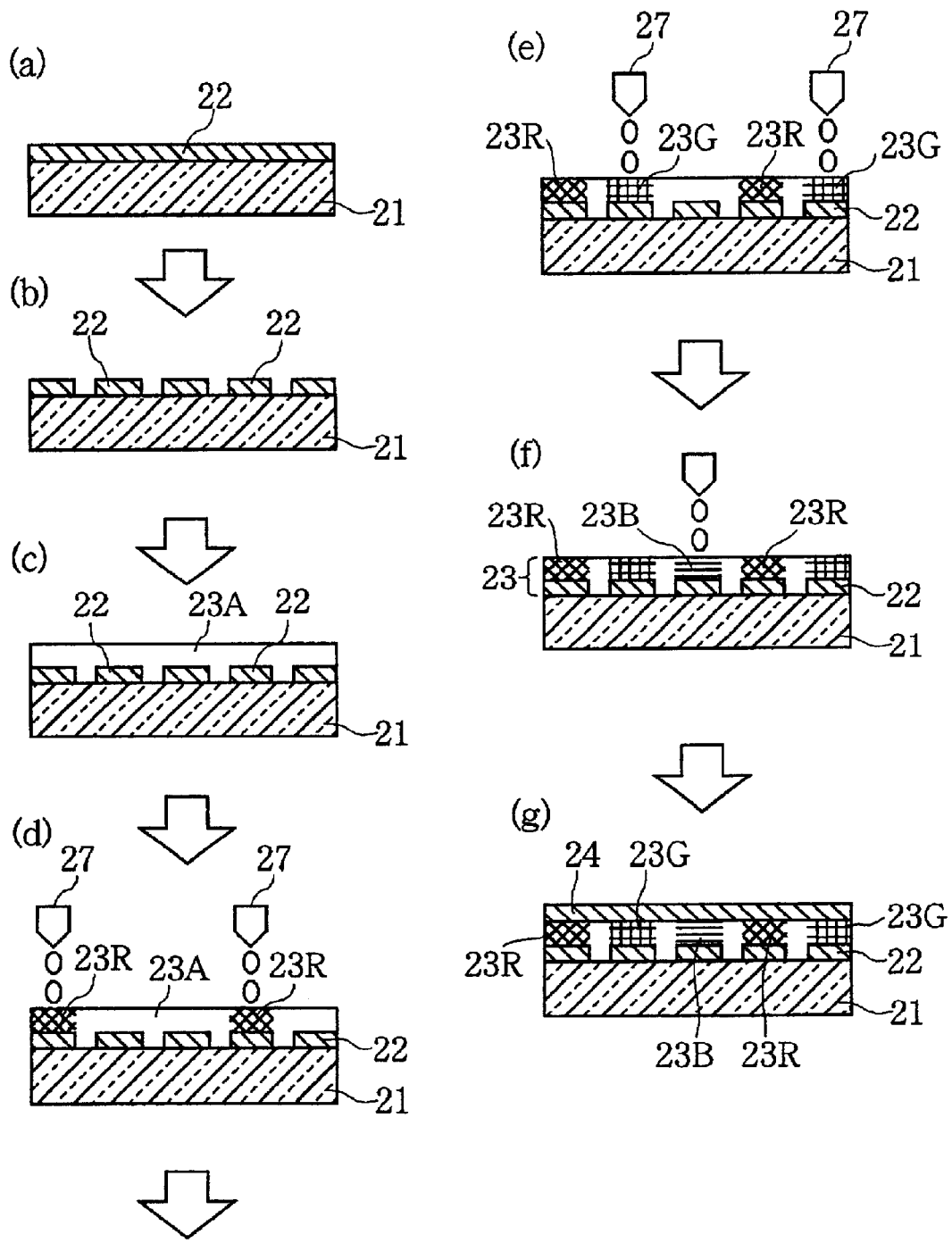
FIG. 3 shows schematic sectional views illustrating the producing method of the organic light-emitting device according to the embodiment 1-2 of the present invention.

Now, description on the producing method of the organic light-emitting device according to the embodiment 1-2 of the present invention will be given. FIG. 3 shows schematic sectional views illustrating the producing method of the organic light-emitting device according to the embodiment 1-2 of the present invention.

(1) First, the anodes 22 made of ITO or equivalent are formed on the substrate 21 by the deposition method such as the sputtering, the electron beam evaporation, and the ion plating, as shown in FIG. 3(a).

(2) Then, the anodes 22 are patterned into a desired pattern (the striped form in this case) as shown in FIG. 3(b). For example, in the case of the ITO electrode, photo resist used is patterned by use of a common photo lithography and then is etched by hydriodic acid or equivalent.

(3) Then, the polymer 23A of e.g. poly-N-vinylcarbazol is deposited on the anodes 22, as shown in FIG. 3(c). Though the deposition may be performed by any of the methods, such as the evaporation, the sputtering, and the method of application, it is performed mainly by the method of application. To be concrete, the solution of poly-N-vinylcarbazol dissolved in solvent such as toluene or chloroform is applied to the substrate 1 by the spin coat method or equivalent. The layer thickness of the polymer 3A is preferably in the range of about 500 to about 3,000, though it is not limited to any particular thickness.

(4) Then, after the polymer 23A is deposited on the anodes, the luminous molecules having a desired luminous color is made to penetrate into a desired location, as shown in FIG. 3(d). Specifically, when a RGB full color panel is produced, the solution of the red luminous molecules 23R dissolved in the solvent is first discharged to drop on the red-color electrodes (every two electrodes) of the striped anodes 22 formed of ITO in the ink-jet method using the ink heads 27, so as to penetrate into them.

(5) Then, the solution of the green luminous molecules 23G is discharged onto the striped green-color anodes 22 by use of the ink heads 27 in the same manner, as shown in FIG. 3(e).

(6) Then, the solution of the blue luminous molecules 23B is discharged onto the blue-color anodes 22. in the same manner, as shown in FIG. 3(f). It is to be noted that any particular limitation is not imposed on the dropping order of the red, green and blue luminous molecules, and the luminous molecules may be dropped in any selected order. The luminous molecules are preferably heat-treated, after dropping. The heat treatment can accelerate the penetration of the luminous molecules 23R, 23G, 23B into the polymer 23A. For further acceleration of the penetration of the luminous molecules into the polymer 23A, it is preferable that a polymer-23A-soluble liquid is used as the solvent to dissolve the luminous molecules.

(7) Then, the striped cathodes 24 are formed to extend orthogonal to the striped anodes 22, as shown in FIG. 3(g). The deposition is performed in the evaporation method or the sputtering using the evaporation mask having a desired pattern.

While in the embodiment 1-2, the luminous molecules are penetrated into the polymer, the charge transport material as well as the luminous molecules may be penetrated into the polymer. Alternatively, the luminous molecules may be penetrated into the polymer in which the charge transport material is dispersed.

The method above allows the luminous molecules 23R, 23G and 23B to penetrate into the polymer in the ink-jet method, so that the need of the application of the polymer solution of high viscosity in the ink-jet method can be eliminated. Therefore, the luminous molecules can be applied without the nozzles of the ink jet being plugged, thus enabling the molecules to be formed into fine patterns.

Figure 5:
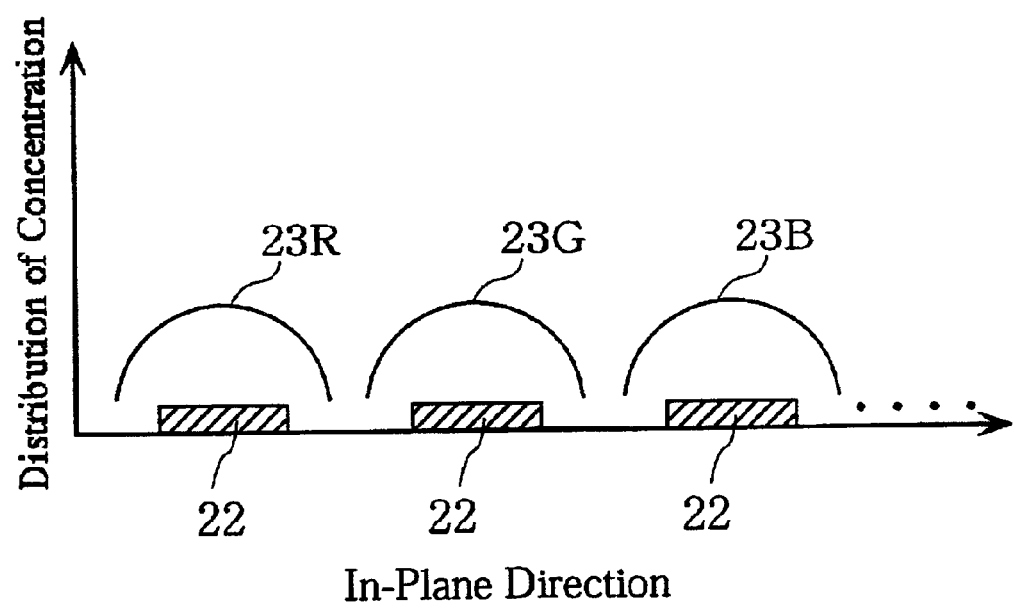
FIG. 5 is a schematic diagram illustrating a distribution of concentration of an emission region of the organic light-emitting device according to the embodiment 1-2 of the present invention.

Referring now to FIG. 5, description will be given on the configuration of the emission region of the organic light-emitting device produced in the producing method mentioned above. FIG. 5 is a schematic diagram illustrating a distribution of concentration of an emission region of the organic light-emitting device according to the embodiment 1-2 of the present invention.

The luminous molecules (Red) 23R, the luminous molecules (Green) 23G and the luminous molecules (Blue) 23B are dispersed over the striped anodes 22 in the in-plane direction of the emission region 23 (in the direction parallel to the electrodes), and the distribution of concentration of each luminous molecule 23R, 23G and 23B becomes the maximum at a substantially center point over the respective anode 22 and gradually reduces toward the both ends of the each anode 22, as shown in FIG. 5.

This constitution enables the luminous molecules 23R, 23G, 23B in the vicinity of their boundaries to be small in concentration. Therefore, the luminous molecules 23R, 23G, 23B are prevented from being mixed in, thus providing little color mixture and thus producing an excellent full color display performance.

Further, the luminous molecules 23R, 23G, 23B are penetrated into the polymer 23A in the ink-jet method using the ink-jets 27, so that the concentration of the luminance molecules 23R, 23G, 23B in the emission region 23 becomes larger on the cathode 24 side than on the anode 22 side.

Consequently, the organic light-emitting device of the embodiment 1-2 can provide increased recombination efficiency of the electron and the hole, to produce improved luminous efficiency, as is the case with the embodiment 1-1 above.

Figure 4:
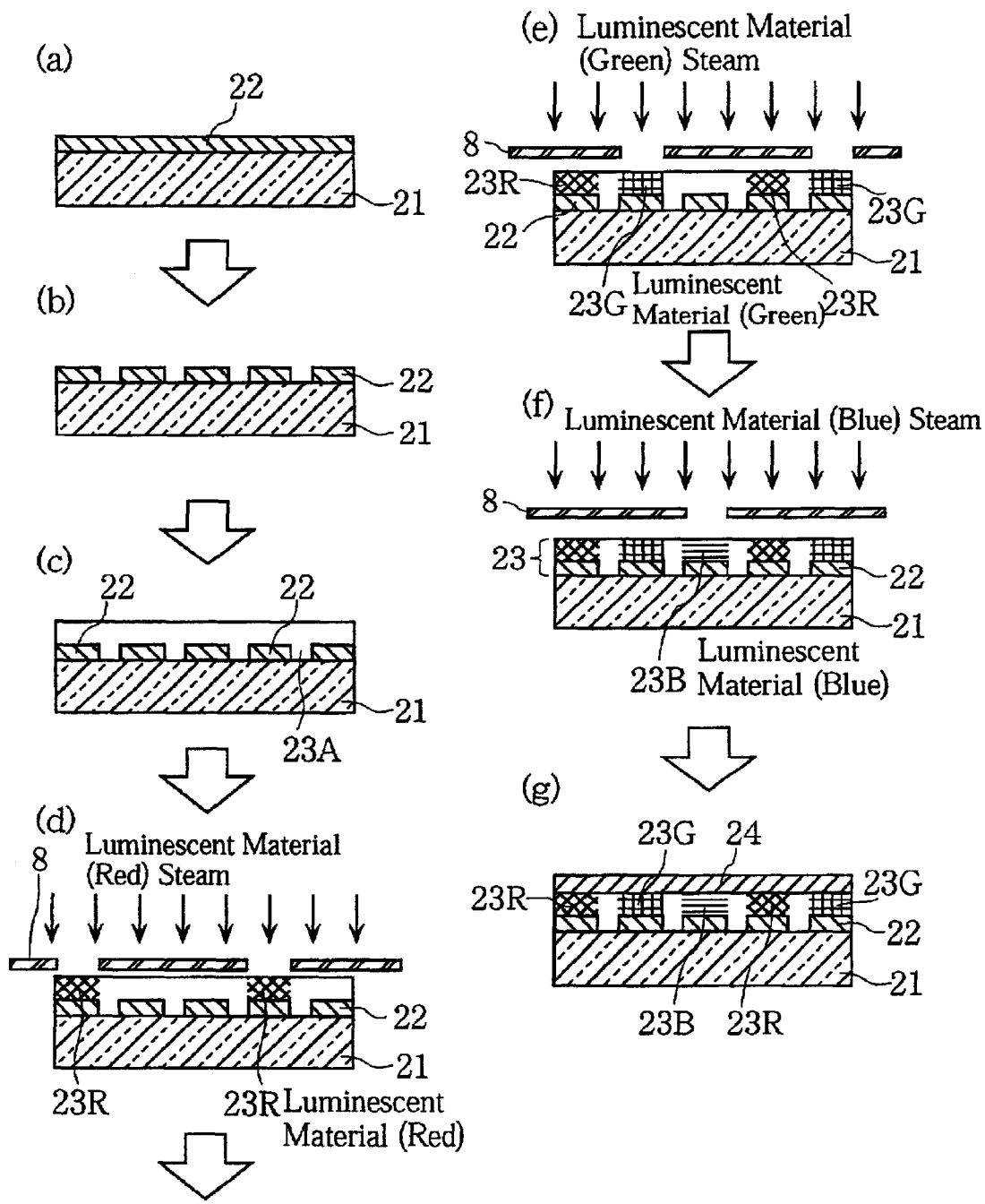
FIG. 4 shows schematic sectional views illustrating another example of the producing method of the organic light-emitting device according to the embodiment 1-2 of the present invention.

FIG. 4 shows schematic sectional views illustrating another example of the producing method of the organic light-emitting device according to the embodiment 1-2 of the present invention.

The procedures shown up to FIG. 4(c) are the same as those of FIG. 3 that the polymer 3A is formed over the substrate 1 on which the anode 2 is formed.

Then, the luminous molecules 3R, 3G, 3B are penetrated in the polymer 3A in the following manner.

First, after a mask 8 having opening formed only on the red-color electrode of the striped anodes 2 of ITO is set on the substrate 1, steaming is performed by use of solution of red luminous molecules dissolved in the solvent, as shown in FIG. 4(d), so that the red luminous molecules 3R are penetrated into the polymer at the desired locations.

Sequentially, the green luminous molecules 3G and the blue luminous molecules 3B are penetrated in the same manner, as shown in FIG. 4(e), (f). It is to be noted that any particular limitation is not imposed on the steaming order of the red, green and blue luminous molecules, and the luminous molecules may be steamed in any selected order. Preferably, the luminous molecules are heat-treated after steamed. The heat-treatment can accelerate the penetration of the luminous molecules 3B–3D into the polymer 3A. For further acceleration of the penetration of the luminous molecules into the polymer 3A, it is preferable that the polymer-3A-soluble liquid is used as the solvent to dissolve the luminous molecules.

Finally, the striped cathodes 4 are formed to extend orthogonal to the striped anodes 2 in the same manner as in FIG. 3.

While in the embodiment above, the luminous molecules are penetrated into the polymer, the charge transport material as well as the luminous molecules may be penetrated into the polymer. Alternatively, the luminous molecules may be penetrated into the polymer in which the charge transport material is dispersed.

Also, the method of penetrating the luminous molecules into the polymer in the printing method can be cited as another example of the producing method of the organic light-emitting device according to the present invention.

Specifically, in place of the luminous molecules 3R, 3G, 3B being penetrated into the polymer 3A in the steaming in FIG. 4(d)–(f), solution of the luminous molecules is applied to and penetrated into the polymer 3A by use of an offset printing method or a screen printing method.

In this variant as well, the luminous molecules are preferably heat-treated after printed, as is the case with the example noted above. Further, the polymer-3A-soluble liquid is used as the solvent to dissolve the luminous molecules. Instead of the luminous molecules being penetrated into the polymer, the charge transport material as well as the luminous molecules may be penetrated into the polymer. Alternatively, the luminous molecules may be penetrated into the polymer in which the charge transport material is dispersed.

Embodiment 1-3

Figure 6:
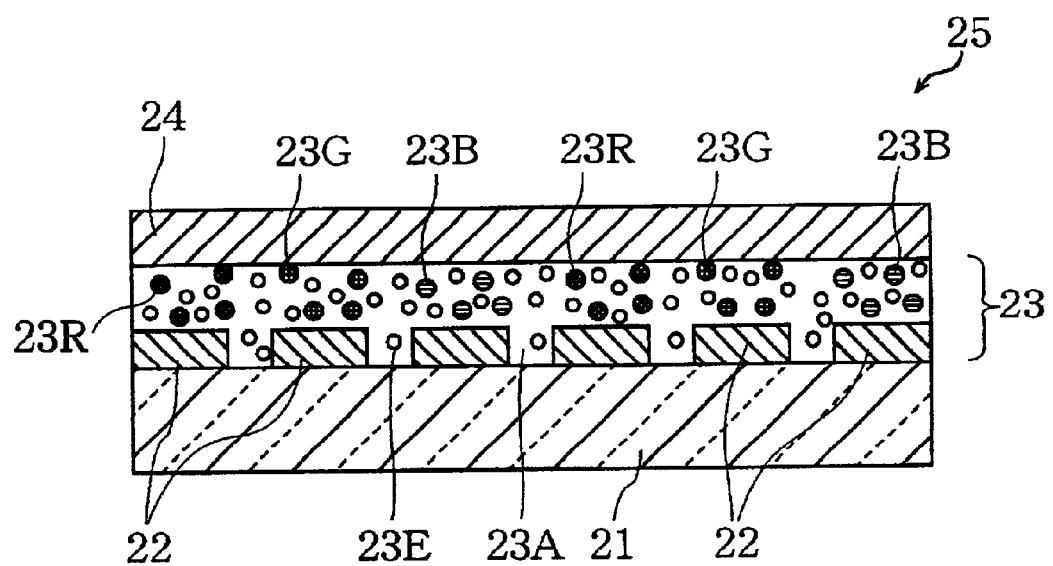
FIG. 6 is a schematic sectional view of an organic light-emitting device according to an embodiment 1-3 of the present invention.

FIG. 6 is a schematic sectional view of an organic light-emitting device according to an embodiment 1-3 of the present invention.

The embodiment 1-3 differs from the embodiment 1-2 in that in addition to the luminous molecules 23R, 23G, 23B, the charge transport material 23E are presented in the emission region 23. Here, the polymer 23A and the charge transport material 23E are seriated in the in-plane direction of the emission region 23. In other words, the charge transport material 23E is uniformly dispersed in the polymer 23A. The luminous molecules 23R, 23G, 23B are dispersed over the striped anodes 22, respectively, as is the case with the embodiment 1-2.

Embodiment 1-4

Figure 7:
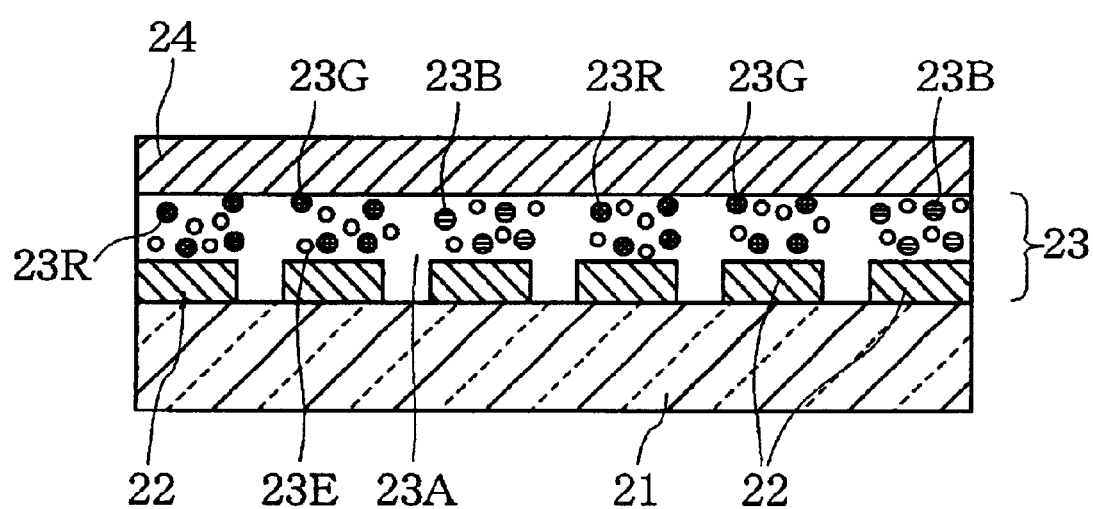
FIG. 7 is a schematic sectional view of an organic light-emitting device according to an embodiment 1-4 of the present invention.

FIG. 7 is a schematic sectional view of an organic light-emitting device according to an embodiment 1-4 of the present invention.

FIG. 7 differs from FIG. 6 in that the charge transport material 23E are not seriated in the in-plane direction of the emission region 23, but are distributed in concentration in the in-plane direction, as is the case with the luminous molecules 23R, 23G and 23B. Specifically, the charge transport material 23E are present in large concentration in a region where the luminous molecules 23R, 23G, 23B are large in concentration.

Commonalities among Embodiments 1-2 to 1-4

Polymer having charge transport capabilities (charge transport polymer) is preferably used as the polymeric material. Among others, polymer having hole transport capabilities (hole transport polymer) is preferable. Preferably, the hole transport polymer has the mobility of carrier of $1\times10^{-7}$ cm$^2$/V·s or more. Particularly preferable is poly-N-vinylcarbazol.

When the hole transport polymer is used, the electron transport material is preferably used as the charge transport material. Further, it is preferable that the electron transport material has the mobility of the carrier of $5\times10^{-8}$ cm$^2$/V·s or more. Particularly preferable are oxazole derivative, oxadiazole derivative, triazole derivative, pyrazine derivative, aldazine derivative, quinolinol complex and derivative thereof. A content of the electron transport material to the polymer is preferably 30–120 weight %. With the electron transport material content of less than 30 weight %, the electron transportability is not sufficient, while on the other hand, with the electron transport material content of more than 120 weight %, the dispersibility into the polymer deteriorates.

Fluophor or phosphor that exhibits luminescence in response to the recombination of the hole and electron may be used as the luminous molecules. The materials that emit particularly strong fluonescence or phosphonescence, which may be used, include coloring matters or laser dyes, such as cyanine dye, merocyanine dye, styrylic dye, anthracene derivative, porphyrin derivative, phthalocyanine derivative, coumarin, DCM and Nile red. Preferably used as the luminous molecule is the material having ionization potential of the luminous molecule smaller than ionization potential of the hole transport polymer and also electron affinity of the luminous molecule larger than electron affinity of the electron transport material.

Embodiment 1-5

Figure 8:
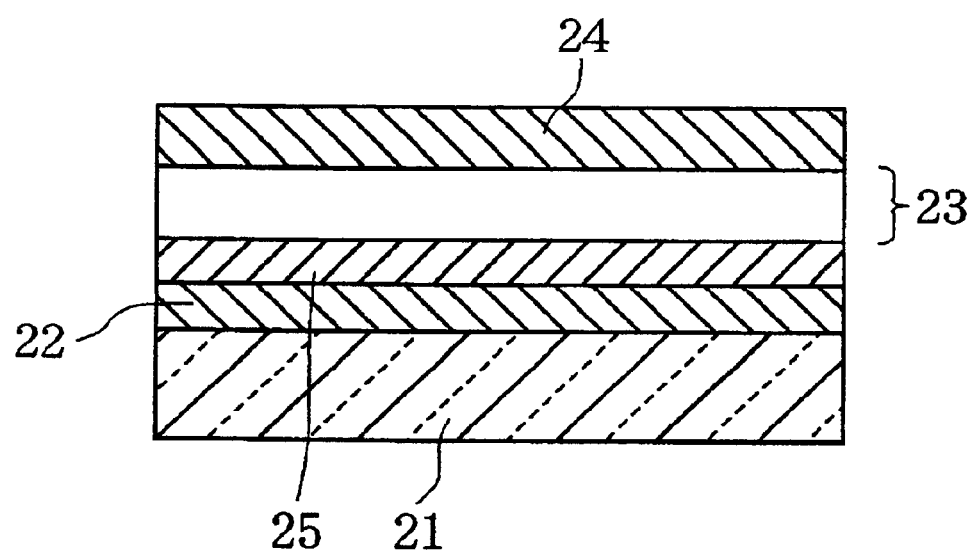
FIG. 8 is a schematic sectional view of an organic light-emitting device according to an embodiment 1-5 of the present invention.
Figure 9:
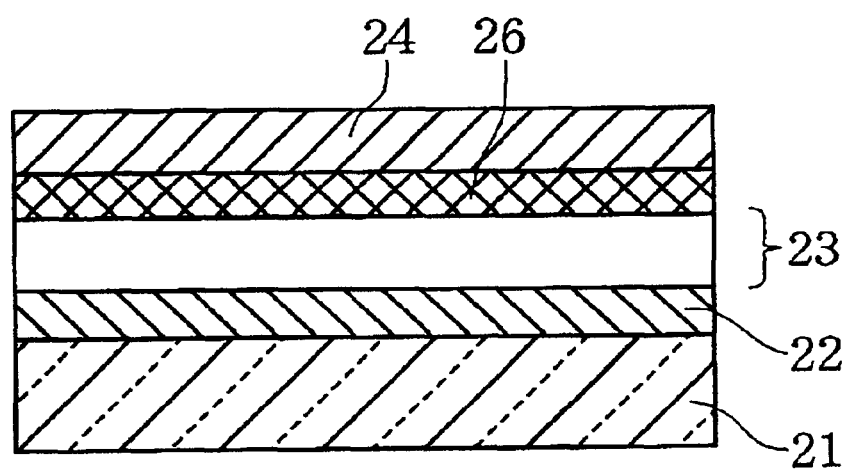
FIG. 9 is a schematic sectional view of another example of the organic light-emitting device according to the embodiment 1-5 of the present invention.
Figure 10:
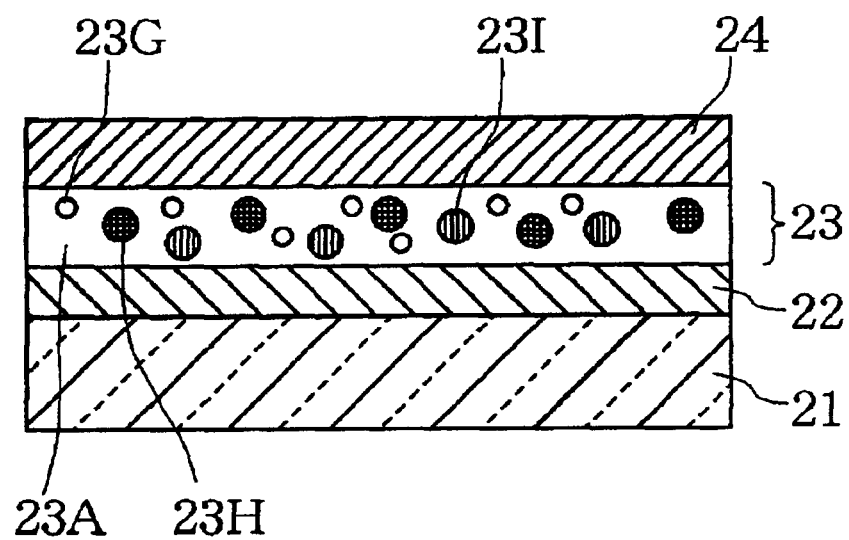
FIG. 10 is a schematic sectional view of yet another example of the organic light-emitting device according to the embodiment 1-5 of the present invention.

FIGS. 8–10 are schematic sectional views of the organic light-emitting device according to an embodiment 1-5 of the present invention. In FIGS. 8–10, 25 designates a hole injection layer, 26 designates an electron injection layer, 23G designates the luminous molecules, 23H designates hole transport material, and 23I designates electron transport material.

The hole injection layer 25 is inserted for the purpose of subserving the injection of the hole from the anode 22 into the emission region 23. Preferably, the material used for the hole injection layer 25 has the relation among the ionization potential of the hole injection layer (Ip(h)), the ionization potential of the polymer (Ip(p)) and the ionization potential of the anode or the work function (Ip(a)) of the anode being Ip(a)<Ip(h)<Ip(p). It is particularly preferable that the hole injection layer comprises at least one material of polyaniline derivative, polythiophene derivative and amorphous carbon.

The electron injection layer 26 is inserted for the purpose of subserving the injection of the electron from the cathode 24 into the emission region 23. Desirably, the material used for the electron injection layer 26 has the electron affinity or work function smaller than the work function of the cathode. It is particularly preferable that the electron injection layer comprises at least one material of dilithium phthalocyanine, disodium phthalocyanine and organic boron complex compound.

The hole transport material 23H is introduced for the purpose of subserving the injection of the hole from the anode 22 into the emission region 23, as is the case with the hole injection layer. However, differently from the hole injection layer 25, the hole transport material is not inserted in between the anode 22 and the emission region 23 in the form of a layer, but is directly dispersed in the emission region.

Preferably, the material used for the hole transport material 23H has the ionization potential smaller than the ionization potential of the polymer. A content of the hole transport material to the polymer is preferably 10–120 weight %. With the hole transport material content of less than 10 weight %, the hole cannot be injected fully, while on the other hand, with the hole transport material content of more than 120 weight %, the dispersibility into the polymer deteriorates.

The effects produced by the introduction of the hole injection layer 25, the electron injection layer 26 and the hole transport material 23H will be described with reference to the related diagrams. FIGS. 11–14 are energy level diagrams of the organic light-emitting device according to the present invention.

Figure 11:
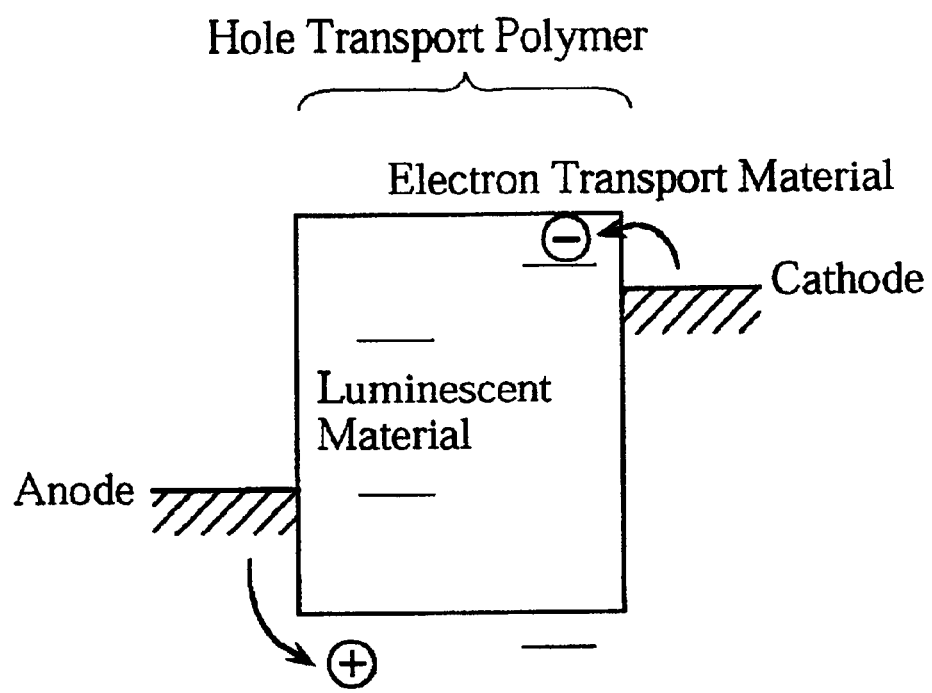
FIG. 11 is an energy level diagram of the organic light-emitting device according to the embodiment 1-5 of the present invention.
Figure 12:
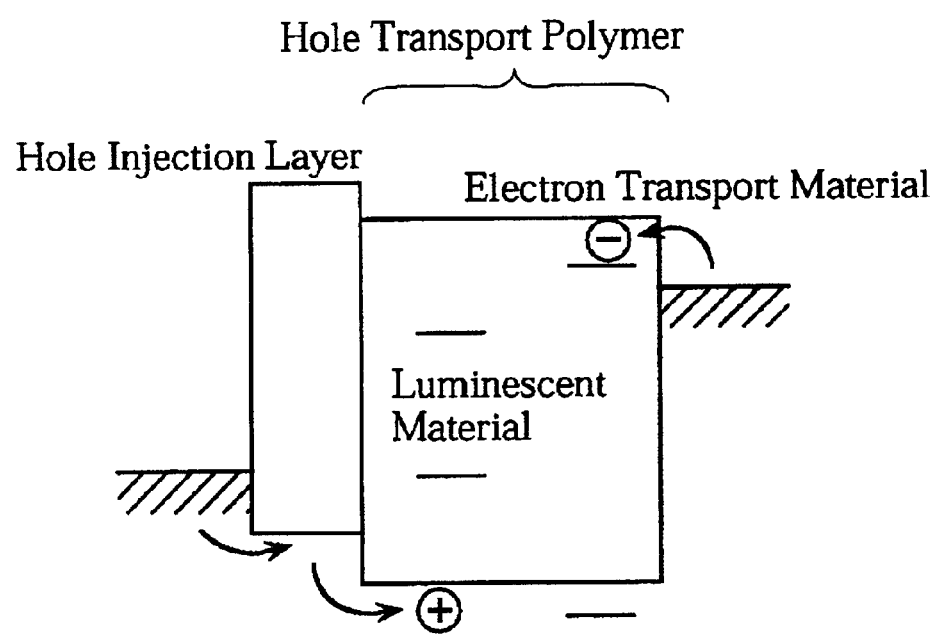
FIG. 12 is an energy level diagram of the organic light-emitting device according to the embodiment 1-5 of the present invention.
Figure 13:
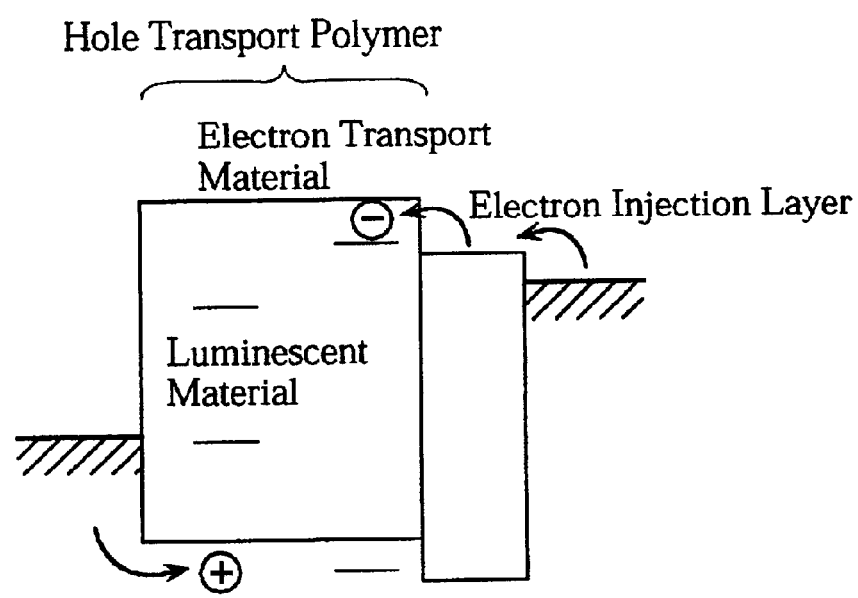
FIG. 13 is an energy level diagram of the organic light-emitting device according to the embodiment 1-5 of the present invention.
Figure 14:
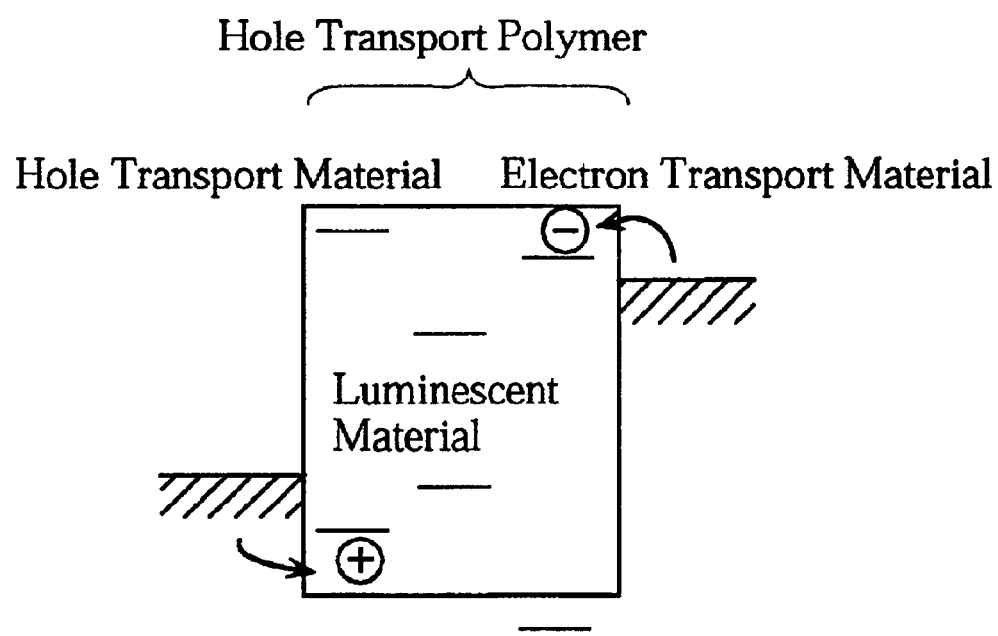
FIG. 14 is an energy level diagram of the organic light-emitting device according to the embodiment 1-5 of the present invention.

FIG. 11 shows an energy level diagram and an operation mechanism of an organic light-emitting device having the structure of anode/emission region (hole transport polymer+electron transport material+luminous molecules (luminescent material))/cathode. FIG. 12 shows an energy level diagram and an operation mechanism of an organic light-emitting device having the structure of anode/hole injection layer/emission region (hole transport polymer+electron transport material+luminous molecule/cathode. As already noted, when a voltage is applied to the organic light-emitting device, the hole is injected from the anode into the emission region and the electron is injected from the cathode into the emission region. In more detail, as shown in FIG. 11, the both carriers are injected into the material of smaller injection barrier. In other words, the hole is injected into the hole transport polymer in the emission region, and the electron is injected into the electron transport material in the emission region. It should be noted that the smaller the injection barrier for the both carriers (hole and electron) become, the more the injection of the carriers facilitates and the more the driving voltage reduces. This reduction of the driving voltage can provide improved power efficiency for emission (emitting efficiency for input power) even when the current efficiency is identical. For example, when the hole injection layer having the ionization potential between the anode and the hole transport polymer is inserted, the hole injection barrier is relaxed, as shown in FIG. 12, and the driving voltage can also be lowered. Further, when the hole injection barrier is greater than the electron injection barrier, as shown in FIG. 11, the hole injection barrier is lowered so that an improved balance between the injection rate of the hole and the injection rate of the electron is produced, and as such can allow the current efficiency to be expectably improved by the aforesaid effects. FIG. 13 shows an energy level diagram of an organic light-emitting device having the structure of anode/emission region (hole transport polymer+electron transport material+luminous molecules)/electron injection layer/cathode. As is the case with the hole injection barrier, the electron injection barrier can also be lowered by inserting the electron injection layer smaller in electron affinity than the cathode, as shown in FIG. 13, thus producing reduction in driving voltage and improvement in luminous efficiency. FIG. 14 shows an energy level diagram of an organic light-emitting device having the structure of anode/ emission region (hole transport polymer+hole transport material+electron transport material+luminous molecules)/ cathode. In this case, since the ionization potential of the hole transport material is smaller than that of the hole transport polymer, the hole is directly injected into the hole transport material in the emission region from the anode, as shown in the diagram, so that the injection barrier is lowered, as compared with the case of the hole being injected into the hole transport polymer. Hence, as is the case with the structure of the hole injection layer being inserted, the driving voltage can be reduced and at the same time the current efficiency can be expectedly improved.

Of course, the above-noted structures may be combined to provide the structure wherein both of the hole injection layer and the electron injection layer are inserted; the structure wherein the emission region comprises the hole transport polymer+hole transport material+electron transport material+luminous molecules and further the electron injection layer is inserted; or the structure wherein the luminous molecules and the charge transport material are distributed in concentration in the layer thickness direction of the emission region.

While in the above-mentioned embodiments 1-1 to 1-5, examples of the simple matrix organic light-emitting device are shown, modification may be made, such as, for example, forming the light emitting device structured as mentioned above on the thin film transistor to produce an active matrix display panel.

Now, experimental examples based on the embodiments mentioned above will be described in further detail.

EXPERIMENTAL EXAMPLE 1

The organic light-emitting device was produced as mentioned below, in accordance with the procedures of FIG. 3 illustrated in the aforesaid Embodiment 1-1.

A glass substrate having thickness of 0.7 mm was used as the substrate 1 and ITO was deposited thereon in the form of the anode 2 by the sputtering method. The ITO was deposited to have thickness of about 1,000 and the sheet resistance was set at about 150Ω/□. The ITO was patterned in the striped form having width of 300 μm by use of photo lithography.

Then, after the substrate was washed and subjected to oxygen plasma treatment, poly-N-vinylcarbazol (PVK) (molecular weight of about 28,000) was deposited thereon as the polymer 3A. The PVK is the hole transport polymer and the mobility of the carriers is about $2 \times 10^{-6}$ cm$^2$/V·s. The deposition was performed in the spin coat method, using the solution in which 300 mg of PVK was dissolved in 30 ml of toluene. The spin coat was performed with spin in a closed state in the conditions of 500 rpm/10 sec. and of 1,000 rpm/30 sec.

Then, the PVK was heat-treated at 110° C. for 1 minute by use of a hot plate. It was about 1,000 in layer thickness.

Then, the luminous molecules were dropped on the ITO electrodes at desired locations by use of a commercially available ink-jet printer, to form the emission region. Nile red was used as red luminous molecules (3R), coumarin 6 was used as green luminous molecules (3G), and coumarin 47 was used as blue luminous molecules (3B). The respective luminous molecules were discharged from the ink head 7 in the form of solution in which 1 mg of luminous molecules were dissolved 10 ml of chloroform. Every time the luminous molecules were dropped, they were heat-treated at 110° C. for 1 minute by use of the hot plate.

Finally, Li/Al laminated electrodes were deposited as the cathodes 4 by the vacuum evaporation method. The deposition was performed under the degree of vacuum of about $5 \times 10^{-6}$ Torr. First, Li was allowed to evaporate by 10 at a rate of about 0.5/sec. and then Al was allowed to evaporate by 1,500 at a rate of about 30/sec. The cathodes was formed into the striped form orthogonal to the anodes 2 by use of the evaporation mask and having the width of 300 μm.

The energy levels of the respective materials are as follows. The ionization potential of the ITO is 4.9 eV, the ionization potential of the PVK is 5.6 eV, the electron affinity is 2.0 eV, the ionization potential of Nile red is 5.3 eV, the electron affinity is 3.5 eV, the ionization potential of coumarin 6 is 5.4 eV, the electron affinity is 2.9 eV, the ionization potential of coumarin 47 is 5.4 eV, and the electron affinity is 2.5 eV. The work function of Li is 2.9 eV and the work function of Al is 4.3 eV.

When an elemental analysis of the region where the coumarin 6 was dropped was made with respect to the layer thickness direction, in order to examine the distribution of concentration of the luminous molecules in the emission region 3, it was found that the quantity of sulfur contained only in the coumarin 6 gradually decreased from the cathode side toward the anode side and there were no coumarin 6 left in the vicinity of the anode.

In the organic light-emitting device thus produced, when a forward voltage of the order of 10V was applied across the selected striped anode and cathode, the part (critical area) sandwiched between the both electrodes emitted light brightly in the respective colors corresponding to the luminous molecules (Nile red: red, coumarin 6: green, and coumarin 47: blue). Thus, the simple matrix display capable of emitting light in the desired colors at desired locations (critical areas) was produced.

The current efficiency of each luminescent color (cd/A), the driving voltage at a luminance of 100 cd/m$^2$ and the power efficiency (lm/W) at a luminance of 100 cd/m$^2$ are shown in TABLE 1.

TABLE 1

|  | Current efficiency (cd/A) | | | Driving voltage (at 100 cd/m$^2$)(V) | | | Power efficiency (at 100 ed/m$^2$)(lm/W) | | |
| --- | --- | --- | --- | --- | --- | --- | --- | --- | --- |
|  | Red | Green | Blue | Red | Green | Blue | Red | Green | Blue |
| Experimental Example 1 | 1.5 | 3.0 | 1.7 | 12.0 | 11.0 | 12.0 | 0.4 | 0.9 | 0.4 |

TABLE 1-continued

| | Current efficiency (cd/A) | | | Driving voltage (at 100 cd/m$^2$)(V) | | | Power efficiency (at 100 cd/m$^2$)(lm/W) | | |
|---|---|---|---|---|---|---|---|---|---|
| | Red | Green | Blue | Red | Green | Blue | Red | Green | Blue |
| Experimental Example 2 | 3.0 | 6.0 | 3.4 | 10.4 | 9.0 | 10.0 | 0.9 | 2.1 | 1.1 |
| Experimental Example 3 | 3.3 | 7.2 | 4.0 | 9.2 | 8.0 | 9.0 | 1.1 | 2.8 | 1.4 |
| Experimental Example 4 | 1.8 | 4.1 | 2.0 | 10.5 | 9.2 | 10.3 | 0.5 | 1.4 | 0.6 |
| Experimental Example 5 | 1.9 | 4.2 | 2.0 | 10.5 | 9.0 | 10.0 | 0.6 | 1.5 | 0.6 |
| Experimental Example 6 | 1.9 | 4.2 | 2.1 | 10.4 | 9.0 | 10.1 | 0.6 | 1.5 | 0.7 |
| Experimental Example 7 | 1.8 | 4.1 | 2.0 | 10.5 | 9.0 | 10.0 | 0.5 | 1.4 | 0.6 |
| Experimental Example 8 | 1.7 | 4.0 | 2.1 | 10.2 | 8.8 | 9.9 | 0.5 | 1.4 | 0.7 |
| Experimental Example 9 | 1.8 | 4.5 | 2.2 | 10.3 | 8.9 | 9.9 | 0.5 | 1.6 | 0.7 |
| Experimental Example 10 | 3.5 | 7.1 | 3.8 | 9.0 | 7.6 | 8.7 | 1.2 | 2.9 | 1.4 |
| Experimental Example 11 | 1.6 | 3.2 | 1.5 | 12.0 | 11.0 | 12.1 | 0.4 | 0.9 | 0.4 |
| Experimental Example 12 | 3.0 | 6.1 | 3.2 | 10.4 | 9.0 | 10.1 | 0.9 | 2.1 | 1.0 |
| Experimental Example 13 | 3.4 | 7.0 | 4.0 | 9.2 | 8.0 | 9.1 | 1.2 | 2.7 | 1.4 |
| Experimental Example 14 | 1.5 | 3.1 | 1.6 | 10.5 | 9.2 | 10.2 | 0.4 | 1.1 | 0.5 |
| Experimental Example 15 | 3.0 | 6.1 | 3.0 | 10.5 | 9.0 | 10.0 | 0.9 | 2.1 | 0.9 |
| Experimental Example 16 | 3.5 | 7.2 | 3.9 | 10.4 | 9.0 | 10.1 | 1.1 | 2.5 | 1.2 |

EXPERIMENTAL EXAMPLE 2

In Experimental example 1, in place of the PVK being deposited as the polymer 3A, the PVK in which 2-(4-biphenyl)-5-(4-tert buthylphenyl)-1,3,4-oxadiazole (PBD) was dispersed. The PBD is the electron transport material and the mobility of the carriers is about $2 \times 10^{-6}$ cm$^2$/V·s. The ionization potential is 6.1 eV and the electron affinity is 2.4 eV. The deposition was performed in the same conditions as those of the experimental example 1 by the spin coat method, using the solution in which 300 mg of PVK and 180 mg of PBD are dissolved in 30 ml of solvent in which toluene and chloroform were mixed in the proportion 1:1.

The properties of this device are shown in TABLE 1.

EXPERIMENTAL EXAMPLE 3

In Experimental example 1, in place of the luminous molecules being dropped, the mixed solution of the luminous molecules and the PBD (electron transport material) was dropped.

Specifically, the solution in which 1 mg of Nile red+100 mg of PBD, 1 mg of coumarin 6+100 mg of PBD, and 1 mg of coumarin 47+100 mg of PBD were respectively dissolved in 30 ml of solvent in which toluene and chloroform were mixed in the proportion 1:1 was dropped on the PVK by the ink jet method.

The properties of this device are shown in TABLE 1.

EXPERIMENTAL EXAMPLE 4

In Experimental example 1, the hole injection layer was inserted in between the anode and the emission region.

In short, the device was structured, as shown in FIG. 8. The hole injection layer was formed by the spin coat method using a commercially available polythiophene derivative, to have layer thickness of 150, before the deposition of the PVK. The ionization potential of the polythiophene derivative used here is 5.3 eV.

The properties of this device are shown in TABLE 1.

EXPERIMENTAL EXAMPLE 5

As a substitution for the polythiophene derivative as the hole injection layer of the experimental example 4, a commercially available polyaniline derivative that exhibits equivalent ionization potential to the above-noted polythiophene derivative was used. The deposition of the polyaniline derivative was performed in the same manner as in the experimental example 2, to have layer thickness of 150.

The properties of this device are shown in TABLE 1.

EXPERIMENTAL EXAMPLE 6

As a substitution for the polythiophene derivative as the hole injection layer of the experimental example 4, amorphous carbon was used. The amorphous carbon was formed to have layer thickness of 100 by the sputtering method. The ionization potential of the amorphous carbon is 5.2 eV.

The properties of this device are shown in TABLE 1.

EXPERIMENTAL EXAMPLE 7

In Experimental example 1, the electron injection layer was inserted in between the emission region and the cathode.

In short, the device was structured, as shown in FIG. 9. Dilithium phthalocyanine was used and deposited as the electron injection layer by the vacuum evaporation method after the luminous molecules were dropped over the PVK. Sequentially, Al was deposited as the cathode. The electron injection layer and the cathode were formed in the manner that after dilithium phthalocyanine was deposited 10 at a rate of about 0.3/sec., Al was deposited 1,500 at a rate of about 30/sec. The electron affinity of dilithium phthalocyanine is 3.0 eV.

The properties of this device are shown in TABLE 1.

EXPERIMENTAL EXAMPLE 8

As a substitution for the dilithium phthalocyanine as the electron injection layer of the experimental example 7, disodium phthalocyanine that exhibits equivalent electron affinity thereto was used. The deposition of the disodium phthalocyanine was performed in the same manner as in the experimental example 7, to have layer thickness of 10.

The properties of this device are shown in TABLE 1.

EXPERIMENTAL EXAMPLE 9

As a substitution for the dilithium phthalocyanine as the electron injection layer of the experimental example 7, 4,4,8,8-tetrakis (1H-pyrazole-1-yl) pyrazabole was used. The deposition of the 4,4,8,8-tetrakis (1H-pyrazole-1-yl) pyrazabole was performed in the same manner as in the experimental example 7, to have layer thickness of 10. The electron affinity of the 4,4,8,8-tetrakis (1H-pyrazole-1-yl) pyrazabole is 2.3 eV The properties of this device are shown in TABLE 1.

EXPERIMENTAL EXAMPLE 10

In the experimental example 3, in place of PVK being deposited as the polymer 3A, the PVK in which N,N'-diphenyl-N,N'-bis (3-methylphenyl)-1,1'-biphenyl-4,4'-diamine (TPD) is dispersed as the hole transport material. In short, the device shown in FIG. 10 was produced. The ionization potential of TPD is 5.4 eV. The deposition was performed in the same conditions as those of the experimental example 1 by the spin coat method, using the solution in which 300 mg of PVK and 180 mg of PBD were dissolved in 30 ml of mixed solvent in which toluene and chloroform were mixed in the proportion 1:1.

The properties of this device are shown in TABLE 1.

EXPERIMENTAL EXAMPLE 11

In accordance with the procedure of FIG. 4, the organic light-emitting device was produced. After the procedures until FIG. 4(c) were performed in the same manner as in the experimental example 1, the luminous molecules are penetrated into the polymer 3A by steaming, to form the emission region. The luminous molecules used Nile red, coumarin 6 and coumarin 47, as is the case with the experimental example 1. The steaming was performed in the following manner. First, after the mask having the openings at portions corresponding to the red-color electrodes of the striped anodes 2 formed of ITO was set on the substrate, the polymer was subjected to the steam generated by heating the solution in which 10 mg of Nile red was dissolved in 10 ml of toluene. Further, it was heat-treated at 110° C. for 1 minute by use of a hot plate. Thus, the Nile red was penetrated into the substrate at the desired positions thereof. Sequentially, after the mask was shifted in position so that the openings were over the green-color electrodes, the polymer was subjected to the steam generated by heating the solution in which 10 mg of coumarin 6 was dissolved in 10 ml of toluene and further was heat-treated at 110° C. for 1 minute. Sequentially, after the mask was shifted in position in the same manner, the polymer was treated by the steaming using the solution in which 10 mg of coumarin 47 was dissolved in 10 ml of toluene and further was heat-treated at 110° C. for 1 minute. Finally, the Li/Al laminated electrodes were deposited as the cathodes 24 in the vacuum evaporation method in the same manner as in the experimental example 1.

The properties of this device are shown in TABLE 1.

EXPERIMENTAL EXAMPLE 12

In the experimental example 11, in place of PVK being deposited as the polymer 3A, the PVK in which 2-(4-biphenyl)-5-(4-tert buthylphenyl)-1,3,4-oxadiazole (PBD) was dispersed was deposited. The deposition was performed in the same conditions as those of the experimental example 1 by the spin coat method, using the solution in which 300 mg of PVK and 180 mg of PBD were dissolved in 30 ml of mixed solvent in which toluene and chloroform were mixed in the proportion 1:1.

The properties of this device are shown in TABLE 1.

EXPERIMENTAL EXAMPLE 13

In the experimental example 11, in place of the luminous molecules being steamed, the mixed solution of the luminous molecules and the PBD was steamed.

Specifically, the solution in which 1 mg of Nile red+100 mg of PBD, 1 mg of coumarin 6+100 mg of PBD, and 1 mg of coumarin 47+100 mg of PBD were respectively dissolved in 30 ml of mixed solvent in which toluene and chloroform were mixed in the proportion 1:1 was used and steamed on the PVK.

The properties of this device are shown in TABLE 1.

EXPERIMENTAL EXAMPLE 14

In the experimental example 1, in place of the luminous molecules being dropped, the luminous molecules were penetrated in the printing method. After the PVK was deposited on the substrate in the same procedure as in the experimental example 1, the solution in which 1 mg of Nile red was dissolved in 10 mg of toluene was applied to the desired ITO electrodes in the screen printing method and then was heat-treated at 10° C. for 1 minute by use of the hot plate. Likewise, the solution in which 1 mg of coumarin 6 and coumarin 47 were dissolved in 10 ml of toluene was applied to the desired ITO electrodes in the screen printing method and then was heat-treated at 110° C. for 1 minute by use of the hot plate. Finally, the Li/Al laminated electrodes were deposited as the cathodes 24 in the vacuum evaporation method in the same manner as in the experimental example 1.

The properties of this device are shown in TABLE 1.

EXPERIMENTAL EXAMPLE 15

In the experimental example 14, in place of PVK being deposited as the polymer 3A, the PVK in which 2-(4-biphenyl)-5-(4-tert buthylphenyl)-1,3,4-oxadiazole (PBD) was dispersed was deposited. The deposition was performed in the same conditions as those of the experimental example 1 by the spin coat method, using the solution in which 300 mg of PVK and 180 mg of PBD were dissolved in 30 ml of mixed solvent in which toluene and chloroform were mixed in the proportion 1:1.

The properties of this device are shown in TABLE 1.

EXPERIMENTAL EXAMPLE 16

In the experimental example 14, in place of the luminous molecules being applied in the screen printing method, the mixed solution of the luminous molecules and the PBD was applied in the screen printing method. Specifically, the solution in which 1 mg of Nile red+100 mg of PBD, 1 mg of coumarin 6+100 mg of PBD, and 1 mg of coumarin 47+100 mg of PBD were respectively dissolved in 30 ml of mixed solvent in which toluene and chloroform were mixed in the proportion 1:1 was applied onto the PVK in the screen printing method.

The properties of this device are shown in TABLE 1.

Embodiments of Second Inventive Group

The light-emitting device of the second inventive group is characterized in that it comprises the emission region provided between the anode and the cathode and comprising material contributable to the emission and also comprises a collecting means, provided between the anode and the cathode, for collecting the material contributable to the emission into a specific region. To be more concrete, the light-emitting device comprises the emission region provided between the anode and the cathode and comprising material contributable to the emission; a porous or roughened region between the anode and the cathode; and material contributable to the emission which is arranged on as well as in the vicinity of a front surface of the porous or roughened region.

As mentioned above, the provision of the porous or roughened region can allow the material contributable to the emission to be collected to a specific region (on or in the vicinity of the front surface of the porous or roughened region) and also can enlarge a surface area of the hole-and-electron recombination region where the material contributable to the emission is present. This can produce the emission with high luminance.

The application of the light-emitting device thus constructed to a display or a lighting device can produce the display or lighting device having high luminance performance.

In the following, the embodiment 2-1 illustrates the light-emitting device having the structure in which the emission region is made porous. The embodiment 2-2 illustrates the structure in which the emission region is roughened. Further, the embodiment 2-3 illustrates the structure in which the charge transport region is made porous or is roughened.

Embodiment 2-1

Figure 15:
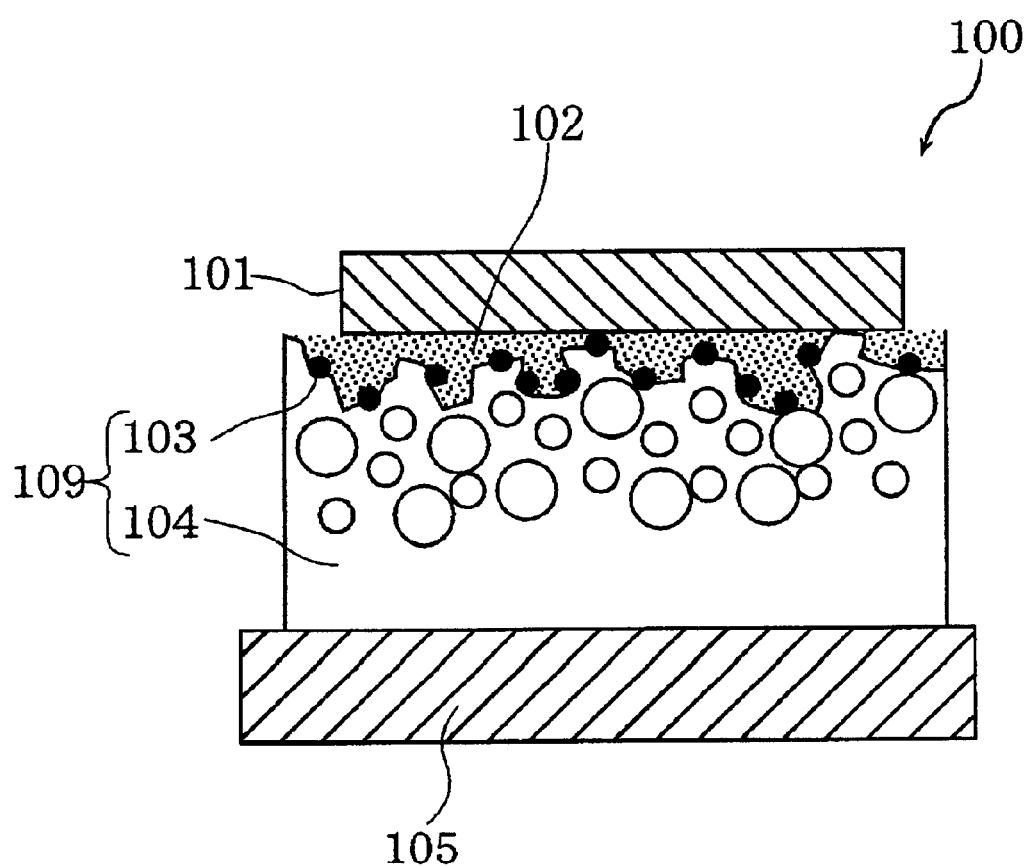
FIG. 15 is a schematic sectional view of an organic light-emitting device according to an embodiment 2-1 of the present invention.

FIG. 15 is a schematic sectional view of an organic light-emitting device according to an embodiment 2-1 of the present invention.

As shown in FIG. 15, an organic light-emitting device 100 comprises an anode 105 formed on a substrate (not shown), a cathode 101 arranged in opposition to the anode 105, an emission region 109 arranged between the anode 105 and the cathode 101, and a leveled layer 102 arranged between the cathode 101 and the emission region 109.

The emission region 109 comprises an organic layer 104 which is made porous on the cathode 101 side thereof, and luminance molecules 103 arranged on a front surface of the organic layer 104 thus made porous.

Further, a leveled layer 102 comprising charge transport material is formed on the front surface of the organic layer 104 and the cathode 101 is laminated on the leveled layer 102.

This constitution, in which the luminous molecules 103 are collected on the front surface of the organic layer 104 as was made porous to enlarge a surface area thereof and also the hole-and-electron recombination region in which the luminous molecules 103 are present is made porous to enlarge a surface area thereof, can produce the emission with increased luminance. In addition, the leveled layer 102 comprising the charge transport material is provided on the surface of the organic layer 104 as was made porous, thus producing the results that joint surfaces of adjoining electrodes (cathodes 101) can be kept smooth; that leakage of current can be prevented; and that the hole or the electron can be injected and transported with efficiency.

Also, the filling of the charge transport material into the porous organic layer 104 enables the hole or the electron to be injected or transported with efficiency.

The coloring matters whose quantum efficiency is nearly 1, including laser dyes such as coumarin 6, DCM and phenoxazone 9, are preferably used for the luminous molecules 103. In addition to this, fused rings, such as naphthalene, anthracene, pyrene, and naphthacene, and derivatives thereof are also preferable. For example, rubrene has quantum efficiency of nearly 1 and is also an efficient luminous material. In addition, metal complexes, such as Alq and derivative thereof and beryllium benzoquinoline, are also preferable.

The charge transport material that is filled in the porous organic layer 104 or forms the leveled layer 102 must transport the charge reverse in polarity to the charge transported by the porous organic layer 104.

When the porous organic layer 104 is formed as the hole transport organic layer, the electron transport material is chosen as the charge transport material. On the other hand, when it is formed as the electron transport organic layer, the hole transport material is chosen as the charge transport material.

The electron transport materials that may preferably be used include low molecular weight material easy to enter the interior of the porous layer. Metal complex, such as Alq and tris (4-methyl-8-quinolinolato) aluminum, electron deficient compound, such as 4,4,8,8-tetrakis (1H-pyrazole-1-yl) pyrazabole, and 3-(2'-benzothiazolyl)-7-diethylaminocoumarin can be cited as the preferable material. Materials having the hole blocking function, such as bathocuproine and triazole derivative, are also preferable.

The hole transport materials that may be preferably be used include derivative having triphenylamine as fundamental skeleton. For example, tetraphenylbenzidine compound, triphenylamine trimer and benzidine dimer disclosed by Japanese Laid-open (unexamined) Patent Publication No. Hei 7-126615, various triphenyldiamine derivatives disclosed by Japanese Laid-open (unexamined) Patent Publication No. Hei 8-48656, and MTPD (common name: TPD) disclosed by Japanese Laid-open (unexamined) Patent Publication No. Hei 7-65958 are preferable.

The hole transport material, when filled in the porous layer, can be replaced by the electron injection material.

The electron injection materials that may preferably be used include dilithium phthalocyanine, disodium phthalocyanine, magnesium porphin, 4,4,8,8-tetrakis (1H-pyrazole-1-yl) pyrazabole disclosed by Japanese Patent Application No. Hei 11-214712. The hole injection material that may preferably used include copper phthalocyanine, 5,10,15,20-tetraphenyl-21H,23H-porphin copper (In Embodiment 2-2 mentioned later, even when the roughened surface is smoothened to the order of 10 nm, the electron injection material may be replaced by the charge injection material).

In addition to the low molecular weight material, polymeric material may be chosen as the material to be filled in the porous layer, but since there is the possibility that the material could not be fully filled therein by only the application, some measurement, such as heat-treatment at glass transition point, should be taken to thoroughly penetrate the material into the porous layer (In Embodiment 2-2 mentioned later, the polymeric material may be chosen even for filling the roughened surface).

In consideration of making the organic layer porous, organic polymer is preferable for the material to form the organic layer 104. Particularly, when it is made to be porous, the polymer-based organic compound is chosen, since it is subjected to the wet etching process (In Embodiment 2-2 mentioned later, the organic polymer is preferable even for filling the roughened surface).

Material for general purpose applications, such as poly-p-phenylenevinylene (PPV), polyvinyl carbazol (PVK), polymethylmethacrylate (PMMA), polyfluorene and derivatives thereof can be used as the organic polymers to form the organic layer. Further, for the purpose of improving the charge transport capabilities, the electron transport material and the hole transport material may be mixed. The material for general purpose applications may be used.

Preferably, the organic layer is formed to have thickness of 10–1,000 nm. Preferably, the thickness of the region to be made porous of the organic layer falls within about one-third of the whole thickness of the organic layer, or particularly preferably in the range of 5–50 nm. When the organic layer is reduced in thickness to 10 nm or less, short-circuit is caused when a voltage is applied. On the other hand, when it is increased 1,000 nm or more, the applied voltage is increased and the luminous efficiency is reduced. Also, when the region to be made porous is more than one-third of the whole organic layer or more than 50 nm, the organic layer is reduced in density, so that the charge transport performance is deteriorated and also stiffness and adhesion of the layer to the substrate is weakened. On the other hand, when the region to be made porous is less than 5 nm, the above-mentioned effects are not easily produced (In the embodiment 2-2 mentioned later, the same applies to the region to be roughened). In the applied organic layer, it is necessary that the uniform layer should be formed by deposition, first, from the viewpoint of the injection and transport of charge. When viewed microscopically, the organic polymer layer is rough, but the term of "uniform layer" used herein means that the layer is uniform when viewed macroscopically. It is necessary that the roughness of the surface of the deposited layer should be set within 5 nm at least. Making the organic polymer layer porous and rough means that the roughness of the uniformly deposited layer is further increased.

Figure 16:
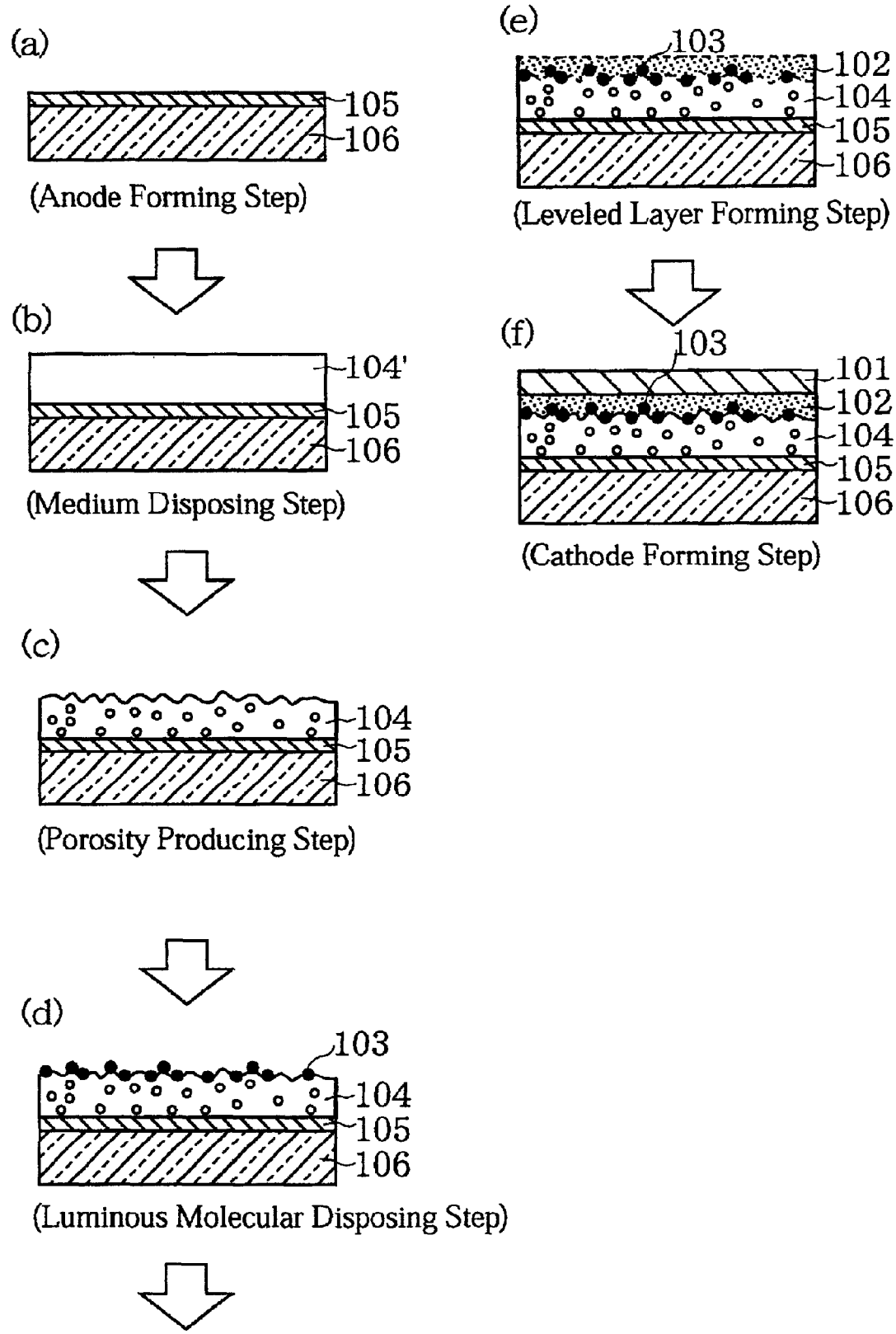
FIG. 16 shows schematic sectional views illustrating the producing method of the organic light-emitting device according to the embodiment 2-1 of the present invention.

Referring now to FIG. 16, the producing method of the organic light-emitting device will be described. FIG. 16 shows schematic sectional views illustrating the producing method of the organic light-emitting device according to the embodiment 2-1 of the present invention.

(1) First, an anode 105 is formed on a substrate 106, as shown in FIG. 16(a) (Anode forming step).

(2) Then, a medium 104' is disposed over the substrate 106, as shown in FIG. 16(b). The medium 104' means the coating film that is produced by the application of the solution obtained by two kinds of material, i.e., organic polymer and organic material that can be eluted to make the layer porous being dissolved in solvent (Medium disposing step).

(3) Then, the medium 104' is dried by heating or by airstream and treated by use of the solvent that does not allow solubilization of the organic polymer and allows solubilization of only the organic material, so as to elute only the organic material, as shown in FIG. 16(c). Then, the region where the organic material are present is hollowed and thereby the organic polymer layer is made porous to thereby produce the organic layer 104 (Porosity producing step).

In the porosity producing step, at least a part of the organic layer 104, to be more specific, at least one of a part of the organic layer 104 on the anode 105 side and a part of the same on the cathode 101 side can be made porous.

(4) Then, luminous molecules 103 are dispersed over the organic layer 104, as shown in FIG. 16(d) (Luminous molecule dispersing step).

(5) Then, a leveled layer 102 comprising the charge transport material is formed on the organic layer 104, as shown in FIG. 16(e) (Leveled layer forming step).

(6) Then, the cathode 101 is formed on the leveled layer 102, as shown in FIG. 16(f) (Cathode forming step).

The proportion of the organic material to be mixed with the organic polymer is preferable 10–50%. This is because when the proportion of the organic material is less than 10%, the layer (organic layer) cannot fully be made porous, while on the other hand, when the proportion of the organic material is more than 50%, the concentration of the layer is lowered, so that the charge transport capabilities of the entire layer is deteriorated and the stiffness and adhesion of the layer to the substrate is weakened. The proportion of the organic material is further preferably 20–30%.

The organic materials that may be chosen for use include oligomer produced with low molecular weight for wide selection of the solvent, in addition to the organic polymer.

The dispersion of the luminous molecules is preferably performed in the evaporation method. The luminous molecules may be brought into solution so that they can be steamed. In the method for penetrating the luminous molecules into the porous organic layer, the luminous molecules are preferably steamed after dispersed (In the embodiment 2-2 mentioned later as well, the luminous molecules are preferably steamed after dispersed).

The organic light-emitting device is enabled to take out the surface emission by making at least one electrode transparent or translucent. Usually, the ITO (indium tin oxide) film is often used for the anode serving as the hole injection electrode. Tin oxide, Ni, Au, Pt and Pd can additionally be cited as the material therefor. The ITO film is formed by use of the deposition method, such as sputtering, electron beam evaporation and ion plating, for the purpose of improving the transparency or reducing the resistivity.

The film thickness is determined from the required sheet resistance and visible light transmittance. The organic light-emitting device is relatively high in driving current density, so that it is often used with thickness of 100 nm or more in order to reduce the sheet resistance.

An alloy comprising a metal of low work function and low electron injection barrier, such as MgAg alloy or AlLi alloy proposed by Tang et al., and a metal of relatively large work function and stable is often used for the cathode serving as the electron injection electrode. For the purpose of the metal of low work function being deposited on the organic layer side to protect the metal of low work function, the metal of large work function may be laminated thickly. Alternatively, a laminated electrode, such as Li/Al and LiF/Al, may be used therefor. These cathodes are preferably formed in the evaporation method or the sputtering method. When the electron injection material, such as dilithium phthalocyanine, disodium phthalocyanine, magnesium porphin, 4,4,8,8-tetrakis (1H-pyrazole-1-yl) pyrazabole, is used for the electrode, the electrode can be formed by only the metal of large work function and stable. This makes it resistant to reaction such as oxidizing and thus enables an enhanced life property.

The substrate may be formed of any material that can support the organic light-emitting device laminating the thin film thereon and is transparent or translucent to take out the emission generated in the organic layer. Glass such as Corning 1737 or polyester or other resin film may be used therefore.

Figure 17:
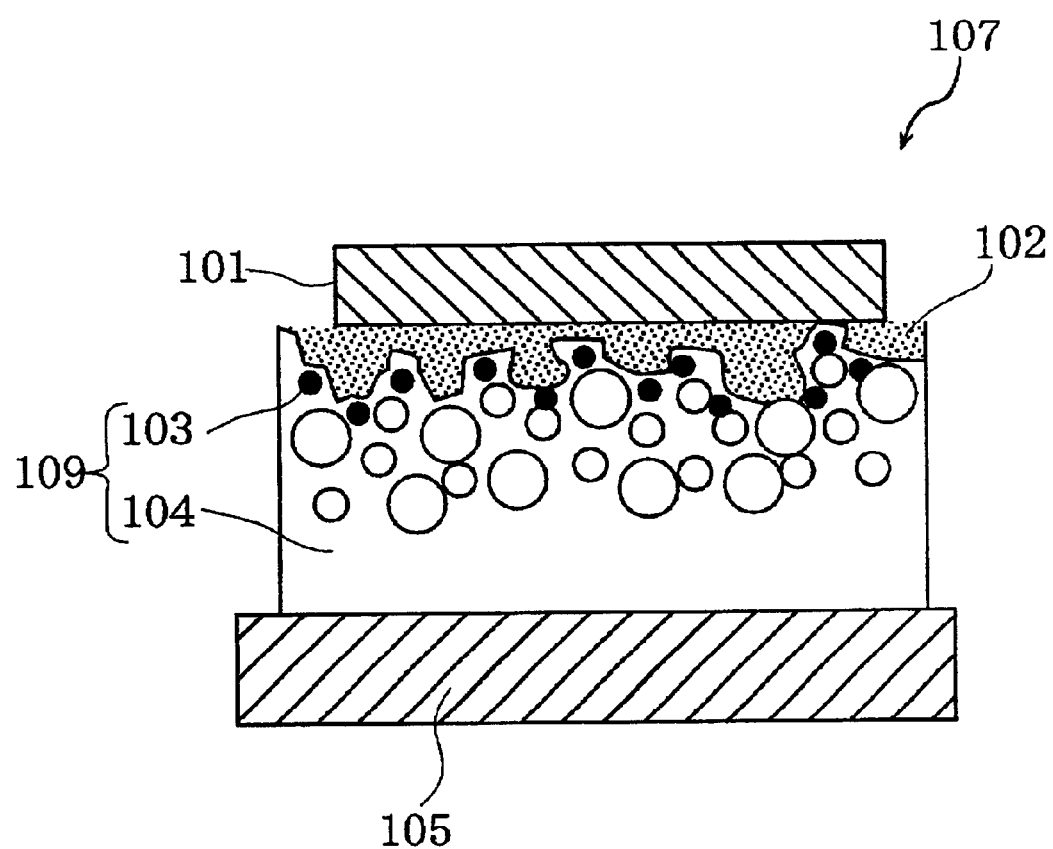
FIG. 17 is a schematic sectional view showing a variant of the organic light-emitting device according to the embodiment 2-1 of the present invention.

FIG. 17 is a schematic sectional view showing a variant of the organic light-emitting device according to the embodiment 2-1 of the present invention.

As shown in FIG. 17, the organic light-emitting device 107 has the constitution in which the luminous molecules 103 of the material contributable to the emission are penetrated in the porous organic layer 104 in the vicinity of the front surface. The luminous molecules 103 can be penetrated in the porous organic layer 104 in the vicinity of the front surface by steaming.

This constitution enables the luminous molecules 103 to be collected in the porous organic layer 104 in the vicinity of the front surface thereof and also enables the surface area in the hole-and-electron recombination region in which the material contributable to the emission to be enlarged, thus enabling the emission with high luminance. The luminous molecules may be disposed on and in the vicinity of the front surface of the organic layer 104.

EXPERIMENTAL EXAMPLE 2-1

Experimental Example 2-1 illustrates an actual example of the organic light-emitting device of the embodiment 2-1. In the following, the description thereon will be given.

Polyvinyl carbazol and butyral resin of low degree of polymerization (available from Sekisui Chemical Co., Ltd., S-LEC B, Part number BL-S) were dissolved in toluene in the proportion 80:20 by weight, to produce the solution.

Then, the solution thus produced was deposited on the ITO-deposited glass substrate in the spin coat method to produce the organic layer having thickness of 100 nm.

The ITO substrate forming thereon the organic layer was dipped in N,N-diimethylformamide, so that only the butyral resin (S-LEC B) was dissolved and removed and, thereafter, it was dried at 200° C. by heating, to thereby produce the porous organic layer.

After the substrate was cooled down to room temperature in a vacuum chamber, the coumarin 6 of laser dyes used as the luminous molecules were dispersed on it at an evaporation rate of 0.01 nm/s for 10 seconds by resistance heating.

Sequentially, 4,4,8,8-tetrakis (1H-pyrazole-1-yl) pyrazabole used as the electron injection material was evaporated at the evaporation rate of 0.01 nm/s for 1 minute.

Finally, an Al electrode was formed at the evaporation rate of 1 nm/s to have layer thickness of about 100 nm and thereby the organic light-emitting device.

When the section of the device was observed by SEM, it was found that the porous layer having diameter of the order of 3–6 nm was formed and the porous region was filled with the electron injection material. When a direct current voltage was applied to this device for evaluation purpose, it was found that the green luminescence of coumarin 6 was obtained and glowed on stably with current efficiency of 8.0 cd/A.

TABLE 2

|  | Current efficiency (cd/A) |
| --- | --- |
| Experimental Example 2-1 | 8.0 |
| Experimental Example 2-2 | 8.2 |
| Experimental Example 2-3 | 7.5 |
| Experimental Example 2-4 | 3.2 |

EXPERIMENTAL EXAMPLE 2-2

In the organic light-emitting device of the experimental example 2-2, 4,4,8,8-tetrakis (1H-pyrazole-1-yl) pyrazabole was evaporated at the evaporation rate of 0.1 nm/s for 2 minutes to thereby produce a leveled layer, for the purpose of providing the leveled layer, instead of filling the porous layer with the electron injection material, in the evaporation of the electron injection material of the experimental example 2-1.

When the section of the device was observed by SEM, it was found that the leveled layer was formed on the porous layer having diameter of the order of 3–6 nm. When a direct current voltage was applied to this device for evaluation purpose, it was found that the green luminescence of coumarin 6 was obtained and glowed on stably with current efficiency of 8.2 cd/A.

EXPERIMENTAL EXAMPLE 2-4

The experimental example 2-4 is for comparison with the experimental examples 2-1 and 2-2 (the organic layer is not made porous).

Polyvinyl carbazol, 2-(4-biphenyl)-5-(4-tert buthylphenyl)-1,3,4-oxadiazole used as the electron transport material, and coumarin 6 used as the luminous molecule material were dissolved in a weight ratio of 100:40:0.2 in the mixed solvent with a ratio of toluene to THF of 1:1 to produce the silution.

Thereafter, the solution was applied to the ITO deposited glass substrate by use of the spinner, to form the organic layer having thickness of 100 nm.

The cathode comprising Li and Al of 1 nm used as the electron injection electrode was formed on that organic layer, to thereby produce the organic light-emitting device.

When a direct current voltage was applied to this device for evaluation purpose, it was found that the green luminescence of coumarin 6 was obtained and the current efficiency was 3.2 cd/A, as shown in TABLE 2.

Thus, the organic light-emitting device having the organic layer as was made porous was dramatically improved in current efficiency, as compared with the one having the organic layer as was not made porous.

Embodiment 2-2

Figure 18:
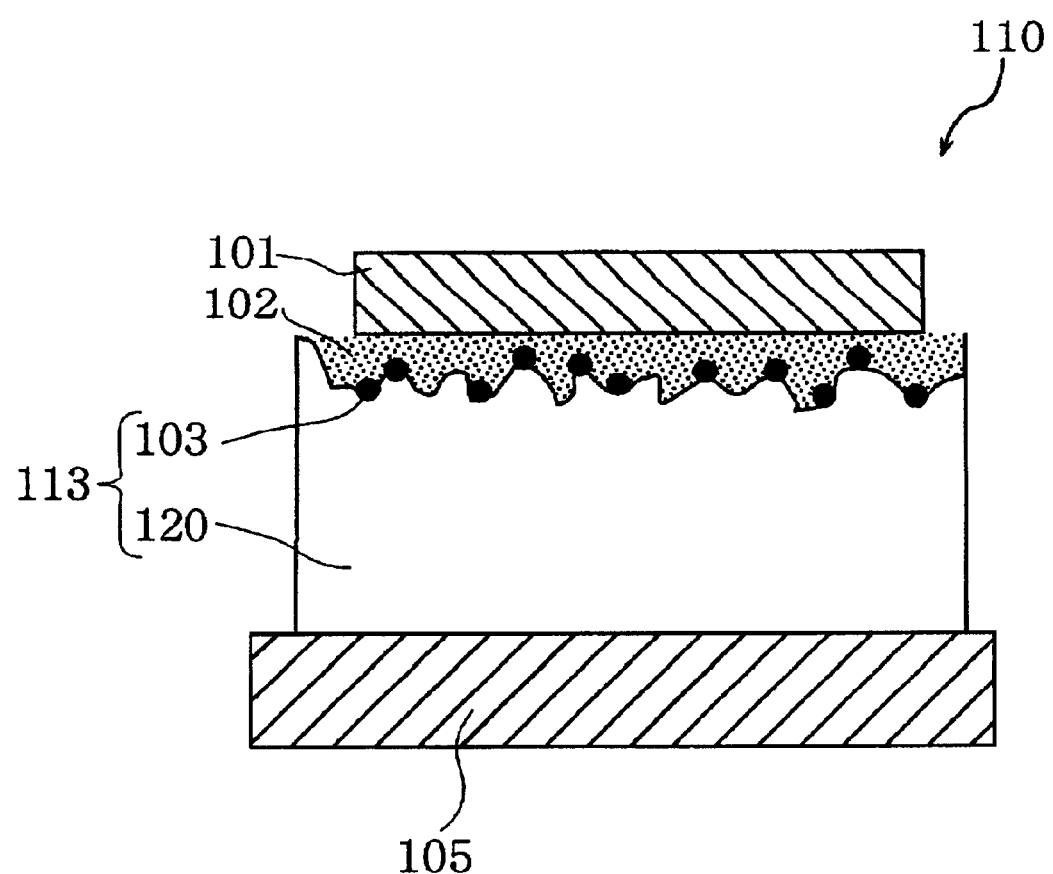
FIG. 18 is a schematic sectional view of an organic light-emitting device according to the embodiment 2-2 of the present invention.

Embodiment 2-2 relates to the organic light-emitting device having the structure in which the emission region is roughened. FIG. 18 is a schematic sectional view of an organic light-emitting device according to the embodiment 2-2 of the present invention.

As shown in FIG. 18, an organic light-emitting device 110 comprises the anode 105, the cathode 101 arranged in opposition to the anode 105, an emission region 113 arranged between the anode 105 and the cathode 101, and a leveled layer arranged between the cathode 101 and the emission region 113.

The emission region 113 comprises an organic layer 120 which is made porous on the cathode 101 side thereof and the luminance molecules 103 arranged on the roughened front surface of the organic layer 120.

Further, the leveled layer 102 comprising charge transport material is formed on the organic layer 120 and the cathode 101 is laminated on the leveled layer 102.

This constitution, in which the luminous molecules 103 are collected on the emission region 113 (on the front surface of the organic layer 120) which is roughened to enlarge its surface area and also the hole-and-electron recombination region in which the luminous molecules 103 are present is roughened to enlarge its surface area, can produce the emission with increased luminance. It is to be noted that as is the case with the embodiment 2-1, the luminous molecules may be penetrated in the organic layer in the vicinity of the front surface thereof or may alternatively be arranged on as well as in the vicinity of the front surface of the organic layer.

Figure 19:
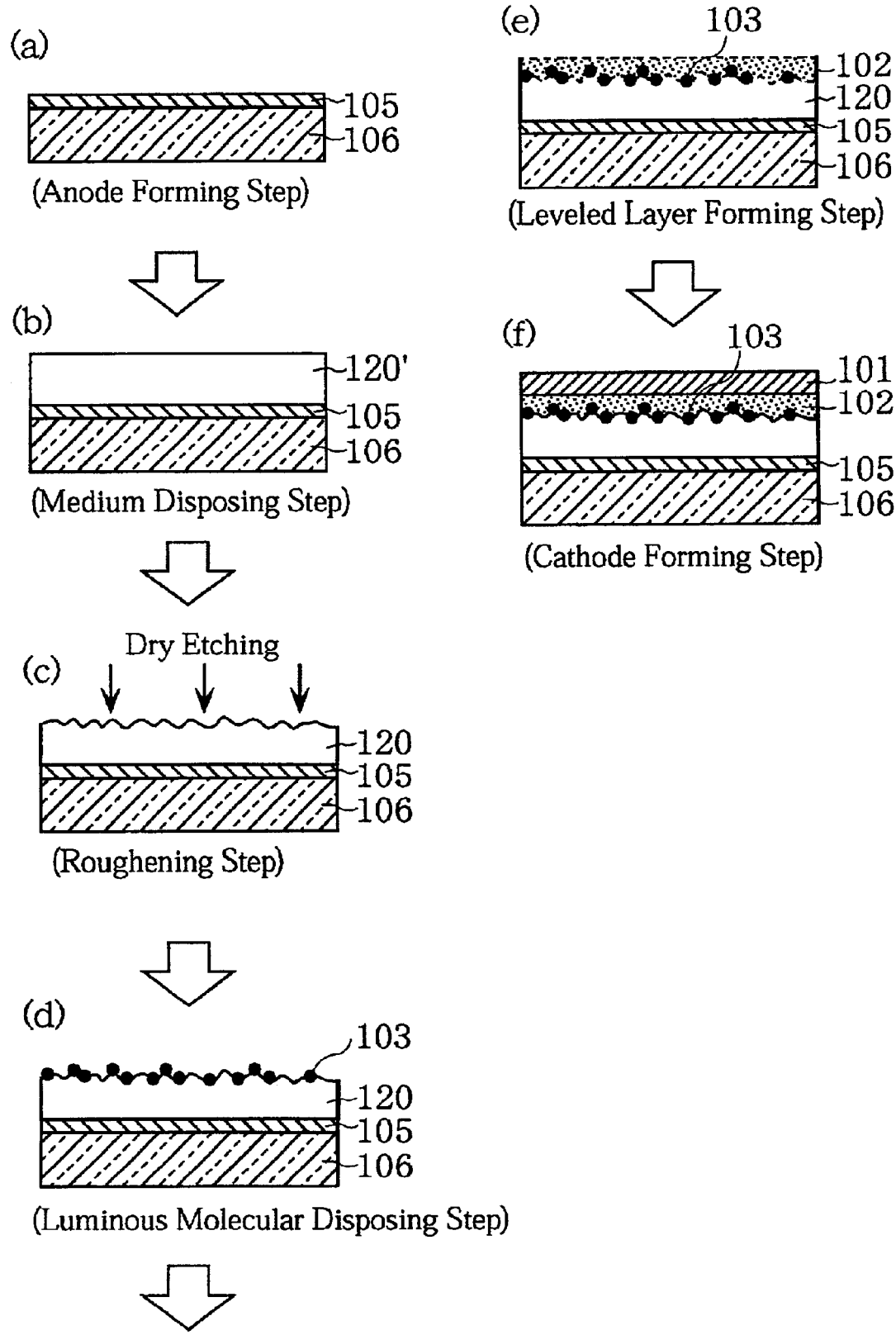
FIG. 19 shows schematic sectional views illustrating the producing method of the organic light-emitting device according to the embodiment 2-2 of the present invention.

Referring now to FIG. 19, the producing method of the organic light-emitting device will be described. FIG. 19 shows schematic sectional views illustrating the producing method of the organic light-emitting device according to the embodiment 2-2 of the present invention.

(1) The anode 105 is formed on the substrate 106 in the same manner as in the step (1) of the producing method as illustrated in Embodiment 2-1 (FIG. 19(a)).

(2) Then, a coating film 120' of a medium is formed on the anode 105 by use of organic polymer forming the organic layer (FIG. 19(b)).

(3) Then, the coating film 120' is etched by dry etching using e.g. a reactive ion etching (RIE) to roughen the front surface of the coating film 120' so as to form the organic layer 120 (FIG. 19(c)).

(4) Then, the luminous molecules 103 are dispersed on the roughened front surface of the organic layer 120 (FIG. 19(d)). The dry etching may be performed by use of a general purpose etching device such as a barrel type one and a parallel flat-plate type one. Depending on the state of the organic layer, Ar gas may simultaneously be introduced.

(5) Then, the leveled layer 102 comprising the charge transport material is formed on the organic layer 120 in the same manner as in Embodiment 2-1 (FIG. 19(e)).

(6) Then, the cathode 101 is formed on the leveled layer 102 (FIG. 19(f).

EXPERIMENTAL EXAMPLE 2-3

Experimental Example 2-3 shows an actual example of the organic light-emitting device of Embodiment 2-2. Specifically, the solution in which polyvinyl carbazol was dissolved in toluene was deposited on the ITO-deposited glass substrate in the spin coat method to produce the organic layer having thickness of 100 nm.

Then, the ITO substrate forming thereon the organic layer was roughened in the dry etching device of parallel flat-plate type in the conditions of: an oxygen flow rate of 60 sccm; pressure of 40 mTorr; and high-frequency output power of 100W for 1 minute and then was disposed in the vacuum chamber.

Then, the coumarin 6 of laser dyes used as the luminous molecules were dispersed on the substrate at an evaporation rate of 0.01 nm/s for 10 seconds in the vacuum evaporation method using the resistance heating.

Sequentially, 4,4,8,8-tetrakis (1H-pyrazole-1-yl) pyrazabole used as the electron injection material was evaporated at the evaporation rate of 0.1 nm/s for 2 minutes.

Finally, the Al electrode was formed at the evaporation rate of 1 nm/s to have layer thickness of about 100 nm and thereby the organic light-emitting device.

When the section of the device was observed by SEM, it was found that the roughened surface of the order of ±3 nm and the leveled layer formed by the electron injection material were formed in the organic layer. When a direct current voltage was applied to this device for evaluation purpose, it was found that the green luminescence of coumarin 6 was obtained and glowed on stably with current efficiency of 7.5 cd/A, as shown in TABLE 2.

Thus, the organic light-emitting device shown in Experimental example 2-3 was dramatically improved in current efficiency by roughening the organic layer, as compared with the organic light-emitting device shown in Experimental example 2-4.

Embodiment 2-3

Figure 20:
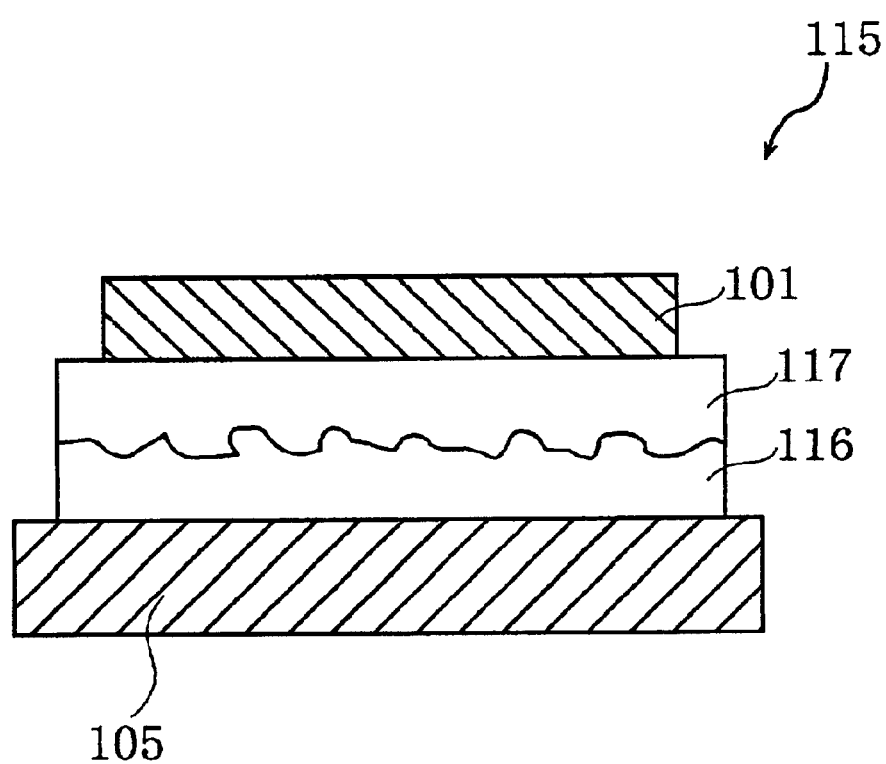
FIG. 20 is a schematic sectional view showing an organic light-emitting device according to an embodiment 2-3 of the present invention.

While Embodiments 2-1 and 2-2 relate to the organic light-emitting devices having the structure in which the emission region is made porous or roughened to produce improved luminous efficiency, this embodiment 2-3 relates to the organic light-emitting device having the structure in which the charge transport region is roughened. FIG. 20 is a schematic sectional view showing an organic light-emitting device according to an embodiment 2-3 of the present invention.

As shown in FIG. 20, an organic light-emitting device 115 comprises the anode 105, the cathode 101 arranged in opposition to the anode 105, an emission region 117 arranged between the anode 105 and the cathode 101, and a charge transport layer 116 arranged between the emission region 117 and the anode 105.

The charge transport layer 116 is roughened at the emission region 117 side by the dry etching. In the structure above, the charge transport layer 116 is the hole transport layer.

This constitution can provide an enhanced contact area of the emission region 117 and the charge transport region 116 and an improved injection efficiency of the holes injected from the anode 105 to the emission region 117.

While in this embodiment, reference is given to the constitution of the charge transport region being roughened, it is needless to say that the charge transport region may be made porous to achieve the equivalent effect to the effect produced by roughening the charge transport region. When the charge transport layer 116 has luminescent properties, the emission region 117 is not necessarily needed, but instead at least either of the anode 105 side and the cathode 101 side of the charge transport layer 116 may be made porous or roughened to produce an improved injection efficiency of the charge from the electrode, as is the case with the above.

INDUSTRIAL APPLICABILITY

As mentioned above, the constitution of the present invention can attain the objects of the present invention satisfactorily.

According to the invention of the first inventive group, the luminous molecules, or the luminous molecules and the charge transport material are penetrated in the polymer, or the polymer in which the charge transport material is dispersed, to thereby provide the organic light-emitting device capable of producing an improved luminous efficiency and at the same time facilitating the patterning even in the polymer dispersed organic light-emitting device.

According to the invention of the second inventive group, in the polymer-based organic light-emitting device, the emission region, which was commonly diffused over the whole organic layer, is collected to a specific region and also the hole-and-electron recombination region where the luminous molecules are present is made porous or roughened to enlarge the surface area, to thereby produce an improved luminous efficiency.

What is claimed is:

1. A light-emitting device, comprising:
    an anode and a cathode having an emission region therebetween,
    wherein the emission region comprises material contributable to emission and a medium for containing the material, wherein the material contributable to the emission has a substantially successive distribution of concentration from the anode side of the emission region toward the cathode side thereof, and
    wherein a part of the emission region that exhibits a maximum concentration of the material contributable to the emission is away from the anode and the cathode.

2. The light-emitting device as set forth in claim 1, wherein the emission region further comprises charge transport material.

3. The light-emitting device as set forth in claim 2, wherein the charge transport material has a substantially successive distribution of concentration from the anode side of the emission region toward the cathode side thereof.

4. The light-emitting device as set forth in claim 1, wherein the emission region comprises, at the side of the emission region near the anode or the cathode, a region where the material contributable to the emission is not present.

5. A lighting device comprising in combination therewith the light-emitting device as set forth in claim 1.

6. A light-emitting device, comprising:
    an anode and a cathode having a charge transport region therebetween,
    wherein the charge transport region comprises charge transport material and a medium for containing the charge transport material wherein the charge transport material has a substantially successive distribution of concentration from the cathode side of the charge transport region toward the anode side thereof, and
    wherein a part of the charge transport region that exhibits a maximum concentration of the charge transport material is away from the anode and the cathode.

7. The light-emitting device as set forth in claim 6, wherein the charge transport region comprises, at the side of the emission region near the anode or the cathode, a region where the charge transport material is not present.

8. A light-emitting device, comprising:
    an anode and a cathode having an emission region therebetween,
    wherein the emission region comprises material contributable to emission and a medium for containing the material, and
    wherein the material contributable to the emission has a distribution of concentration that reduces substantially successively in a direction parallel to a surface of the cathode and a surface of the anode from a substantially center of the emission region toward a periphery thereof.

9. The light-emitting device as set forth in claim 8, wherein said material contributable to emission is a plurality of materials contributable to emission adjacently arranged in a direction parallel to a surface of the cathode and a surface of the anode, wherein each of the plurality of materials contributable to emission is different in luminous color from others of said plurality of materials.

10. The light-emitting device as set forth in claim 8, wherein the emission region further comprises charge transport material.

11. The light-emitting device as set forth in claim 10, wherein the charge transport material has a distribution of concentration that reduces in the direction parallel to the surface of the cathode and the surface of the anode from the substantially center of the emission region toward the periphery thereof.

12. The light-emitting device as set forth in claim 11, wherein the charge transport material has a substantially successive distribution of concentration from the cathode side of the emission region toward the anode side thereof.

13. The light-emitting device as set forth in claim 8, wherein the material contributable to the emission has a substantially successive distribution of concentration from the cathode side of the emission region toward the anode side thereof.

14. The light-emitting device as set forth in claim 8, wherein the emission region includes a region where the material contributable to the emission is not present.

15. The light-emitting device as set forth in claim 8, wherein the medium for containing the material contributable to the emission has charge transport capabilities.

16. The light-emitting device as set forth in claim 8, wherein the medium for containing the material contributable to the emission comprises organic material.

17. The light-emitting device as set forth in claim 8, wherein the medium comprises a polymer.

18. A display comprising in combination therewith the light-emitting device as set forth in claim 8.

19. A method of producing a light-emitting device having an emission region between an anode and a cathode, the method comprising:
    locating a medium on the anode or the cathode;
    and containing material contributable to emission and charge transport material in the medium;
    wherein said containing comprises penetrating the material contributable to the emission and the charge transport material into the medium, so that said materials are contained in the medium.

20. A method of producing a light-emitting device having an emission region between an anode and a cathode, the method comprising:
    locating a medium on the anode or the cathode;
    and containing material contributable to emission and charge transport material in the medium;
    wherein said containing comprises bringing a solution comprising the material contributable to the emission and the charge transport material dissolved in solvent into contact with the medium, so that the materials are penetrated into the medium.

21. A light-emitting device, comprising:
    an anode and a cathode having an emission region therebetween,
    wherein the emission region comprises material contributable to emission and a medium comprising organic material for containing the material,
    wherein at least one of an anode side of the emission region and a cathode side thereof is porous, and wherein the material contributable to emission is collected and included in a surface of the emission region which is porous.

22. The light-emitting device as set forth in claim 21, wherein charge transport material is included in a surface of the emission region which is porous.

23. The light-emitting device as set forth in claim 21, wherein a leveled layer comprising charge transport material is located on a surface of the emission region which is porous.

24. The light-emitting device as set forth in claim 21, wherein the emission region comprises a polymer.

25. A display comprising in combination therewith the light-emitting device as set forth in claim 20.

26. A lighting device comprising in combination therewith the light-emitting device as set forth in claim 21.

27. A light-emitting device, comprising:
an anode and a cathode having an emission region therebetween,
wherein the emission region comprises material contributable to emission and a medium comprising organic material for containing the material,
wherein at least one of an anode side of the emission region and a cathode side thereof is porous, and
wherein the material contributable to emission is collected and included in a region in the vicinity of a surface of the emission region which is porous.

28. A light-emitting device, comprising:
an anode and a cathode having a charge transport region therebetween,
wherein the charge transport region comprises material contributable to emission and a medium comprising organic material for containing the material, and
wherein at least one of an anode side of the charge transport region and a cathode side thereof is porous.

29. The light-emitting device as set forth in claim 28, wherein the charge transport region is a hole transport region.

30. The light-emitting device as set forth in claim 28, wherein the charge transport region is an electron transport region.

31. A light-emitting device, comprising:
an anode and a cathode having an emission region therebetween,
wherein the emission region comprises material contributable to emission and a medium comprising organic material for containing the material,
wherein at least one of an anode side of the emission region and a cathode side thereof is a roughened side, and
wherein the material contributable to emission is collected and included in a surface of the roughened emission region.

32. The light-emitting device as set forth in claim 31, wherein a leveled layer comprising charge transport material is provided on a roughened surface of the emission region.

33. The light-emitting device as set forth in claim 31, wherein the emission region comprises a polymer.

34. A light-emitting device, comprising:
an anode and a cathode having an emission region therebetween,
wherein the emission region comprises material contributable to emission and a medium comprising organic material for containing the material,
wherein at least one of an anode side of the emission region and a cathode side thereof is a roughened side, and
wherein the material contributable to emission is collected and included in a region in the vicinity of a roughened surface of the emission region.

35. A light-emitting device, comprising:
an anode and a cathode having a charge transport region therebetween,
wherein the charge transport region comprises material contributable to emission and a medium comprising organic material for containing the material, and
wherein at least one of an anode side of the charge transport region and a cathode side thereof is a roughened side.

36. The light-emitting device as set forth in claim 35, wherein the charge transport region is a hole transport region.

37. The light-emitting device as set forth in claim 35, wherein the charge transport region is an electron transport region.

38. A method of producing a light-emitting device having an emission region between an anode and a cathode, the method comprising:
locating a medium comprising organic material on the anode or the cathode; and
making at least a part of the medium comprising organic material porous.

39. A method of producing a light-emitting device having an emission region between an anode and a cathode, the method comprising:
locating a medium comprising organic material on the anode or the cathode;
making at least one of an anode side of the medium comprising organic material and a cathode side thereof porous; and
locating material contributable to emission on a porous surface of the medium comprising organic material, so that the emission region is formed by the medium and the material contributable to the emission.

40. The method of producing a light-emitting device as set forth in claim 39, further comprising locating charge transport material on a porous surface of the emission region.

41. The method of producing a light-emitting device as set forth in claim 39, further comprising forming a leveled layer comprising charge transport material on the emission region.

42. The method of producing a light-emitting device as set forth in claim 39, comprising locating a medium containing material soluble in a specified solvent, and eluting the soluble material from the solvent to thereby make the medium porous.

43. A method of producing a light-emitting device having an emission region between an anode and a cathode, the method comprising:
locating a medium comprising organic material on the anode or the cathode;
making at least one of an anode side of the medium comprising organic material and a cathode side thereof porous;
containing material contributable to emission in a region in the vicinity of a porous surface of the medium comprising organic material, so that the emission region is formed by the medium and the material contributable to the emission; and
locating charge transport material on a porous surface of the medium.

44. A method of producing a light-emitting device having an emission region between an anode and a cathode, the method comprising:

locating a medium comprising organic material on the anode or the cathode; and roughening a part of the medium comprising organic material.

45. A method of producing a light-emitting device having an emission region between an anode and a cathode, the method comprising:

locating a medium comprising organic material on the anode or the cathode;

roughening at least one of an anode side of the medium comprising organic material and a cathode side thereof; and locating material contributable to emission on a roughened surface of the medium comprising organic material, so that the emission region is formed by the medium and the material contributable to the emission.

46. The method of producing a light-emitting device as set forth in claim 45, further comprising forming a leveled layer comprising charge transport material on the emission region.

47. The method of producing a light-emitting device as set forth in claim 45, comprising roughening the emission region by dry etching.

48. A method of producing a light-emitting device having an emission region between an anode and a cathode, the method comprising:

locating a medium comprising organic material on the anode or the cathode;

roughening at least one of an anode side of the medium comprising organic material and a cathode side thereof; and containing material contributable to emission in a region in the vicinity of a roughened surface of the medium comprising organic material, so that the emission region is formed by the medium and the material contributable to the emission.

\* \* \* \* \*

UNITED STATES PATENT AND TRADEMARK OFFICE
CERTIFICATE OF CORRECTION

PATENT NO. : 6,910,933 B1
DATED : June 28, 2005
INVENTOR(S) : Mikiko Matsuo et al.

It is certified that error appears in the above-identified patent and that said Letters Patent is hereby corrected as shown below:

Title page,
Item [56], References Cited, insert the following:
-- OTHER PUBLICATIONS
Junji Kido et al., "Characteristics of Organic EL Devices Having Polyaniline as a Buffer Layer," Graduate School of Engineering, Yamagata University --.

Column 37,
Line 13, "as set forth in claim 20" should read -- as set forth in claim 21 --.

Signed and Sealed this

Seventh Day of February, 2006

JON W. DUDAS
*Director of the United States Patent and Trademark Office*